United States Patent
Tonda et al.

(10) Patent No.: US 7,800,960 B2
(45) Date of Patent: Sep. 21, 2010

(54) VOLTAGE GENERATOR FOR NONVOLATILE MEMORY AND WRITING AND ERASING METHOD OF NONVOLATILE MEMORY

(75) Inventors: Yasuhiro Tonda, Kanagawa (JP); Hidetoshi Ozoe, Kanagawa (JP); Hideaki Uemura, Kanagawa (JP); Junichi Yamada, Kanagawa (JP); Kenji Hibino, Kanagawa (JP); Tatsuya Saito, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 21 days.

(21) Appl. No.: 12/071,765

(22) Filed: Feb. 26, 2008

(65) Prior Publication Data
US 2008/0205167 A1   Aug. 28, 2008

(30) Foreign Application Priority Data
Feb. 27, 2007   (JP) .............................. 2007-046527

(51) Int. Cl.
*G11C 5/14* (2006.01)
(52) U.S. Cl. .......................... 365/189.09; 365/189.07; 365/185.18
(58) Field of Classification Search ............ 365/189.09, 365/189.07, 189.03, 185.18, 191, 149, 104, 365/230.06, 185.23
See application file for complete search history.

(56) References Cited

U.S. PATENT DOCUMENTS

| | | | | |
|---|---|---|---|---|
| 6,734,655 | B1 * | 5/2004 | Javanifard et al. | 323/222 |
| 7,262,588 | B2 * | 8/2007 | Matsuo et al. | 323/282 |
| 2007/0210776 | A1 * | 9/2007 | Oka | 323/283 |

FOREIGN PATENT DOCUMENTS

| | | |
|---|---|---|
| JP | 2001-93995 | 4/2001 |
| JP | 2005-317191 | 11/2005 |

* cited by examiner

*Primary Examiner*—Dang T Nguyen
(74) *Attorney, Agent, or Firm*—McGinn IP Law Group, PLLC

(57) ABSTRACT

A voltage generator for nonvolatile memory that generates an applied voltage to be applied to a nonvolatile memory includes a first voltage generator to generate a first voltage corresponding to the applied voltage, a reference voltage generator to generate a reference voltage, a comparator to compare the first voltage with the reference voltage and output a boost operation control signal according to a comparison result, and a booster to generate the applied voltage in a pulse-like voltage waveform by starting or stopping boost operation based on the boost operation control signal. The applied voltage corresponding to the first voltage upon inversion of the boost operation control signal is varied within one pulse-like voltage waveform by varying one of the first voltage and the reference voltage.

20 Claims, 30 Drawing Sheets

VOLTAGE GENERATOR FOR NONVOLATILE MEMORY AND WRITING AND ERASING METHOD OF NONVOLATILE MEMORY

BACKGROUND OF THE INVENTION

1. Field of the Invention

The present invention relates to a voltage generator for nonvolatile memory and, particularly, to a voltage generator for nonvolatile memory which includes a booster.

2. Description of Related Art

There is known a Metal-Oxide-Nitride-Oxide-Silicon (MONOS) nonvolatile semiconductor storage device. The nonvolatile semiconductor storage device of this type writes or erases data by trapping electrons in a dielectric film such as a nitride film. FIG. 27 shows a MONOS memory which holds written information by trapping electrons in a nitride film 61. When writing data in a memory having the structure shown in FIG. 27, voltages of 4.5V, 5.5V and 0V, for example, are applied to a drain electrode 62, a gate electrode 63 and a source electrode 64, respectively. As a result of applying such voltages to each terminal, an inversion layer is generated immediately below the gate, so that electrons which flow from the source to the drain are generated. In the electrons flowing from the source to the drain, hot electrons which are accelerated in a depletion layer that is formed in the vicinity of the drain are generated. The hot electrons are injected from the vicinity of the drain into the gate side, so that the hot electrons are trapped in the nitride film 61. In this way, writing ends.

During writing, a large number of hot electrons are generated in the vicinity of the drain of a memory cell (cf. FIG. 27). Therefore, the electrons which are trapped in the nitride film 61 are concentrated in the vicinity of the drain of the memory cell. Then, after a certain period of time from writing, the electrons which are trapped in the vicinity of the drain move slowly in the nitride film 61. Consequently, the electrons are averaged to a certain extent and trapped in such a state (cf. FIG. 28). Accordingly, a threshold of the memory cell changes with time after writing (cf. FIG. 31). If the threshold of the memory cell significantly decreases after writing as a result of such a change, it causes a failure in proper data reading, which leads to a loss of written information.

FIG. 29 shows a MONOS memory in the case of erasing data which are accumulated in the nitride film 61. When erasing data, voltages of 5V, −3V, 0V and 0V, for example, are applied to the drain electrode 62, the gate electrode 63, the source electrode 64 and a substrate 65, respectively. As a result of applying such voltages, a reverse bias is applied between the drain and the substrate, so that a depletion layer is formed in the vicinity of the drain. Further, because the voltage of the drain electrode 62 is higher than a substrate voltage, a distance between a P-type valence band of the substrate 65 and an N-type conduction band of the drain electrode 62 becomes extremely small. This allows the P-type electrons in the substrate 65 to pass through the depletion layer surrounding the drain electrode 62 and move to the N-type conduction band of the drain electrode 62, so that current flows from the drain electrode 62 to the substrate 65. Furthermore, current increases rapidly as a voltage difference between the drain electrode 62 and the substrate 65 becomes larger. In addition, when the electrons which move from the P-type region of the substrate 65 to the drain electrode 62 pass through the depletion layer, they obtain a large energy due to a high electric field that is generated by a voltage between the drain electrode 62 and the substrate 65. Thus, secondary electrons and holes are generated due to the collision upon entry into the drain electrode 62. The generated holes are hot holes which have a large energy due to a high electric field in the depletion layer. The hot holes are injected into the gate electrode side by a gate voltage. As a result of the injection of the holes into the nitride film 61 in which the electrons are accumulated, the electrons and the holes are combined together. In this way, erasing ends.

However, the holes are also injected into the nitride film in the vicinity of the drain in the erasing of a related art. If the position of the trapped hot electron and the position of the injected hole do not correspond, the trapped hot electrons cannot be erased completely. Further, after a certain period of time is elapsed from erasing, the holes and the electrons move slowly to combine with each other (cf. FIG. 30). Thus, a threshold of the memory cell becomes higher after erasing (cf. FIG. 31). As the threshold of the memory cell becomes higher, current of a memory cell transistor decreases gradually. Thus, the reactivity of a read circuit becomes lower, which results in the reduction of a read speed. In this manner, the threshold of the memory cell (the current of the memory cell) changes after writing and erasing according to a related art. A measure to reduce the change in the threshold of the memory cell which occurs after writing and erasing is disclosed in Japanese Unexamined Patent Application Publication No. 2005-317191.

The technique which is disclosed in Japanese Unexamined Patent Application Publication No. 2005-317191 applies a very low voltage to an upper electrode (gate) existing above an insulating film, in which electrons are trapped, immediately after writing in order to ensure a uniform state of the electrons trapped in the insulating film. The insulating film is a nitride film or the like. The electrons which have been concentrated in the vicinity of the drain during writing are thereby distributed uniformly. This technique creates a balanced state in which electrons hardly move immediately after writing, thereby reducing the change in the threshold of the memory cell with time immediately after writing.

Further, the technique applies a very low voltage to the gate electrode above the insulating film after erasing. The electrons which are not erased during the erase operation or the trapped electrons are thereby immediately combined with the holes, so that the state where the electrons and the holes move slowly after a certain period of time from erasing and the electrons are erased due to the combination of the electrons with the holes is already completed immediately after erasing. It is thereby possible to minimize the change in the threshold of the memory cell after erasing of the memory cell.

The technique which is disclosed in Japanese Unexamined Patent Application Publication No. 2001-93995 describes that the threshold of the memory cell appears differently depending on the position of the electron to be trapped in the insulating film during writing of the memory cell. Using such appearance of the threshold, this technique detects the direction of current flowing to the memory cell and the threshold and reads multi-valued information stored in the memory cell based on the detected information.

However, because the technique of Japanese Unexamined Patent Application Publication No. 2005-317191 needs to apply a very low voltage to the gate of the memory cell immediately after writing or after erasing, it requires a longer operating time for writing and erasing. Further, because the technique also needs to prepare a circuit to generate a very low voltage to be applied to the gate of the memory cell immediately after writing and erasing, it requires a larger circuit size.

SUMMARY

According to an embodiment of the present invention, there is provided a voltage generator for nonvolatile memory that generates an applied voltage to be applied to a nonvolatile memory, which includes a first voltage generator to generate a first voltage corresponding to the applied voltage, a reference voltage generator to generate a reference voltage, a comparator to compare the first voltage with the reference voltage and output a boost operation control signal according to a comparison result, and a booster to generate the applied voltage in a pulse-like voltage waveform by starting or stopping boost operation based on the boost operation control signal. In this voltage generator, the applied voltage corresponding to the first voltage upon inversion of the boost operation control signal is varied within one pulse-like voltage waveform by varying one of the first voltage and the reference voltage According to another embodiment of the present invention, there is provided a writing and erasing method of a nonvolatile memory to perform writing and erasing on a nonvolatile memory by applying a given applied voltage, which includes generating a first voltage corresponding to the applied voltage, generating a reference voltage, varying one of the first voltage and the reference voltage, comparing the first voltage with the reference voltage and generating a boost operation control signal according to a comparison result, generating the applied voltage in a pulse-like voltage waveform by starting or stopping boost operation based on the boost operation control signal, and applying the generated applied voltage to a nonvolatile memory. In this method, the applied voltage corresponding to the first voltage upon inversion of the boost operation control signal is varied within one pulse-like voltage waveform.

In the voltage generator for nonvolatile memory according to the embodiment of the present invention, electrons which are trapped in a dielectric film are trapped uniformly without being concentrated on one place during writing, so that a threshold immediately after writing and a threshold after a certain period of time from writing are not substantially different, thereby preventing dropout of held electrons.

Further, in the voltage generator for nonvolatile memory according to the embodiment of the present invention, in order to erase all electrons which are trapped by writing in a dielectric film during erasing, the positions of holes which are injected into the dielectric film are changed with time so as to be uniformly combined with the electrons to thereby erase all the electron, so that a threshold immediately after erasing and a threshold after a certain period of time from erasing are not substantially different, thereby suppressing variation in the characteristics of a memory cell.

The semiconductor memory circuit of the embodiments of the present invention enables the reduction of a change in a threshold immediately after writing or erasing.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
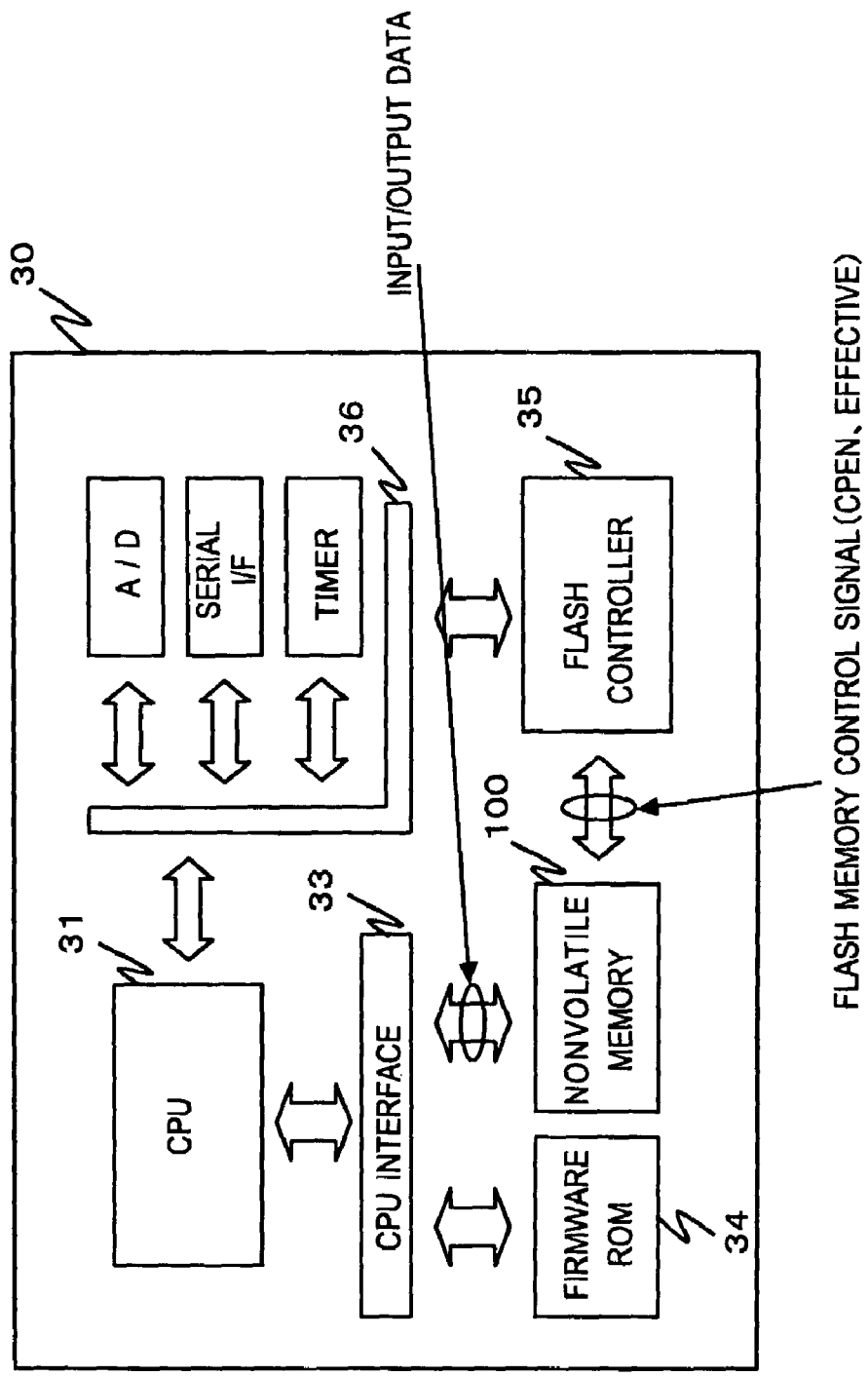
FIG. 1 is a view showing a microcomputer 30 according to a first embodiment of the present invention.

An embodiment of the present invention is described hereinafter with reference to the drawings. FIG. 1 is a block diagram of a microcomputer which includes a nonvolatile memory having a voltage generator for nonvolatile memory. As shown in FIG. 1, a microcomputer 30 includes a CPU 31, a nonvolatile memory 100, a CPU interface 33, a firmware ROM 34, a flash controller 35, and a bus 36.

The CPU 31 executes processing in response to a given instruction. The flash controller 35 is a circuit that generates control signals to be input to the nonvolatile memory 100, such as CPEN, Effective, ERASE, DCLK, WRITE, and address signals A0 to A2. The nonvolatile memory 100 is a circuit that executes writing or erasing data in response to the control signals which are generated by the flash controller 35. The firmware ROM 34 is a memory that stores control program which controls rewrite operation in a flash memory. The CPU interface 33 is a circuit that adjusts data format and operation timing between the CPU and the memory (the firmware ROM and the flash memory) so as to ensure proper execution of data input and output.

In addition to the above components, the microcomputer 30 of this embodiment includes functional circuits (an analog/digital (A/D) converter, a serial interface (I/F), a timer and so on) which are connected with the CPU 31 or the flash controller 35 through the bus 36 and implement the functions as a microcomputer. Such functional circuits differ depending on the kind of a microcomputer and thus not described specifically herein.

Figure 2:
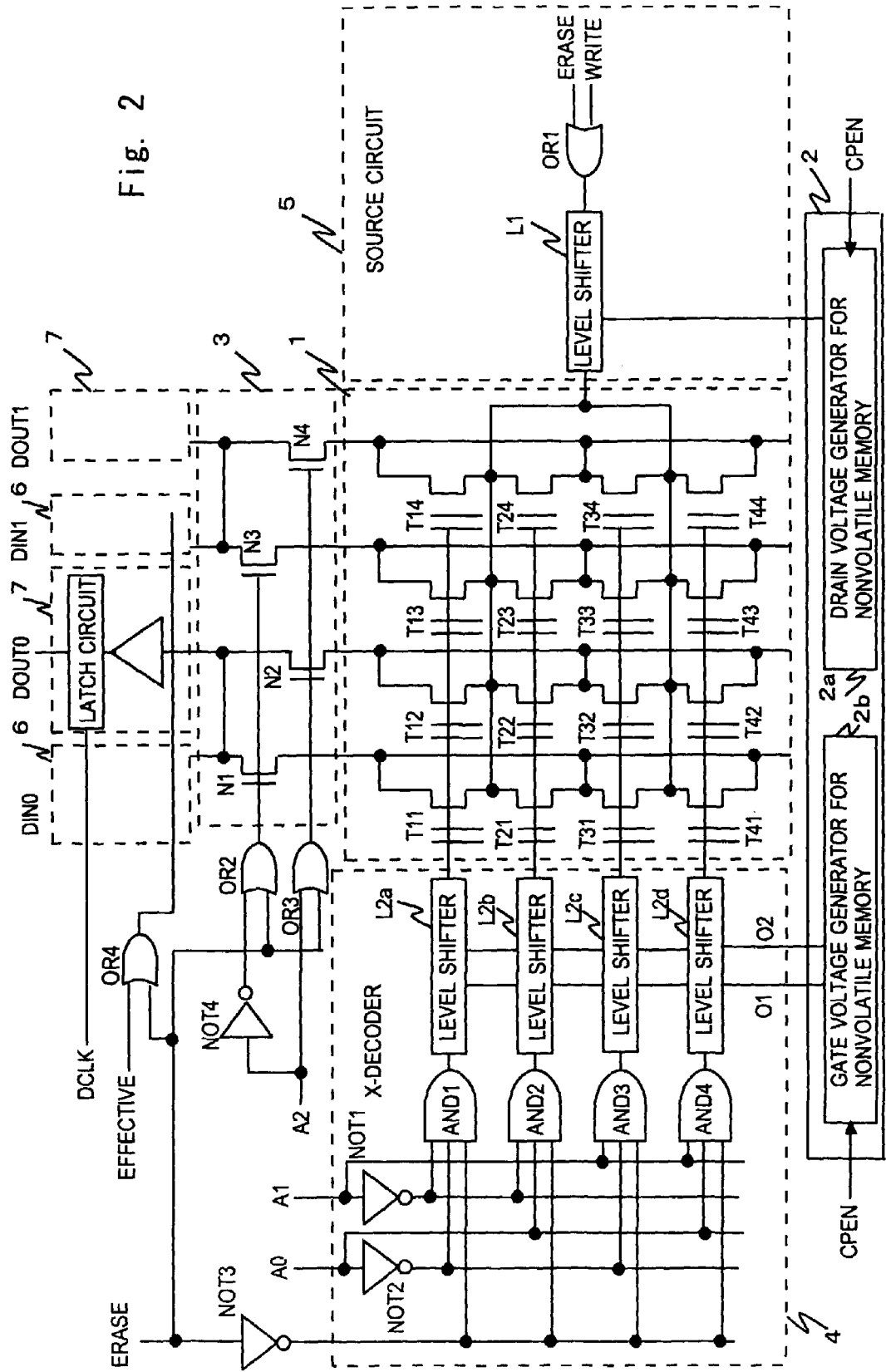
FIG. 2 is a view showing a nonvolatile memory according to the first embodiment.

FIG. 2 is a block diagram showing the nonvolatile memory 100 which has a voltage generator for nonvolatile memory according to the first embodiment of the present invention. As shown in FIG. 2, the nonvolatile memory 100 of this embodiment includes a memory cell array 1, a voltage generator 2 for nonvolatile memory, a selector 3, an X-decoder 4, a source circuit 5, a write circuit 6, and a read circuit 7. The voltage generator 2 for nonvolatile memory includes a drain voltage generator 2a for nonvolatile memory and a gate voltage generator 2b for nonvolatile memory.

The memory cell array 1 includes a plurality of memory cell transistors T11 to T14, T21 to T24, T31 to T34 and T41 to T44, which are formed in a matrix. The gates of the memory cell transistors T11 to T14 are connected in common. The gates of the memory cell transistors T21 to T24, T31 to T34 and T41 to T44 are also connected in common, respectively. The drain of the memory cell transistor T11 is connected to the source of the transistor T21. The drain of the memory cell transistor T21 is connected to the source of the transistor T31. The drain of the memory cell transistor T31 is connected to the source of the transistor T41. The memory cell transistors T12 to T42, T13 to T43, and T14 to T44 are respectively connected in column in the same manner as the transistors T11 to T41 and thus not described herein. In each memory cell transistor of this embodiment, a terminal to receive a larger voltage is a drain, and a terminal to receive a smaller voltage is a source.

The drain voltage generator 2a for nonvolatile memory is a circuit that generates a drain voltage which is necessary for writing or erasing of the memory cell array 1. The voltage which is generated by the drain voltage generator 2a for nonvolatile memory is output to the source circuit 5 according to the input of a booster enable signal CPEN.

The source circuit 5 includes a first level shifter L1 and an OR circuit OR1. The first level shifter L1 is a circuit that outputs the voltage which is output from the drain voltage generator 2a for nonvolatile memory to a drain electrode of the memory cell array 1 according to a level signal ("H" level or "L" level) which is output from the OR circuit OR1.

The gate voltage generator 2b for nonvolatile memory is a circuit that generates a gate voltage which is necessary for writing or erasing of the memory cell array 1. The voltage which is generated by the gate voltage generator 2b for nonvolatile memory is output to the X-decoder 4 according to the input of a booster enable signal CPEN.

The X-decoder 4 includes second level shifters L2a to L2d, AND circuits AND1 to AND4, and NOT circuits NOT1 and NOT2. The level shifters L2a to L2d are circuits that output, to the gate terminal, either one of a minimum voltage or a maximum voltage which are input thereto. The input portions of the level shifters L2a to L2d are connected with the output portions of the AND circuits AND1 to AND4, respectively. The output portions of the level shifters L2a to L2d are connected with the gate electrodes of the memory cell transistors T11 to T14, T21 to T24, T31 to T34 and T41 to T44, respectively. The AND circuit AND1 receives an address signal A1 supplied through the NOT circuit NOT1, an address signal A0 supplied through the NOT circuit NOT2, and an Erase ("L" level) signal supplied through a NOT circuit NOT3. The AND circuit AND2 receives the address signal A1 which is supplied through the NOT circuit NOT1, the address signal A0, and the Erase ("L" level) signal which is supplied through the NOT circuit NOT3. The AND circuit AND3 receives the address signal A1, the address signal A0 which is supplied through the NOT circuit NOT2, and the Erase ("L" level) signal supplied through the NOT circuit NOT3. The AND circuit AND4 receives the address signal A1, the address signal A0, and the Erase ("L" level) signal which is supplied through the NOT circuit NOT3.

The selector 3 is a circuit that selects a given column from the memory cell transistors which are arranged in a plurality of rows and columns when performing writing or reading in the memory cell. The selector 3 includes first to fourth NMOS transistors N1 to N4. The drain of the NMOS transistor N1 is connected with the sources of the memory cell transistors T11, T21, T31 and T41, and the source of the NMOS transistor N1 is connected with the write circuit 6 and the read circuit 7. The drain of the NMOS transistor N2 is connected with the sources of the memory cell transistors T12, T22, T32 and T42, and the source of the NMOS transistor N2 is connected with the write circuit 6 and the read circuit 7. The drain of the NMOS transistor N3 is connected with the sources of the memory cell transistors T13, T23, T33 and T43, and the source of the NMOS transistor N3 is connected with the write circuit 6 and the read circuit 7. The drain of the NMOS transistor N4 is connected with the sources of the memory cell transistors T14, T24, T34 and T44, and the source of the NMOS transistor N4 is connected with the write circuit 6 and the read circuit 7. The gates of the first and third NMOS transistors N1 and N3 are connected with the output portion of the OR circuit OR2, and the gates of the second and fourth NMOS transistors N2 and N4 are connected with the output portion of the OR circuit OR3. The input portion of the OR circuit OR2 receives the Erase ("L" level) signal and an address signal A2 which is supplied through a NOT circuit NOT4. The input portion of the OR circuit OR3 receives the Erase signal and the address signal A2.

The write circuit 6 is a circuit that outputs write data DIN0 or DIN1 to the memory cell transistor which is selected by the address signal A0 to A2 according to the input of an actual write signal Effective. The read circuit 7 is a circuit that outputs read data DOUT0 or DOUT1 which are read from the memory cell transistor which is selected by the address signal A0 to A2 according to the input of a data latch signal DCLK. The drain voltage generator 2a for nonvolatile memory and the gate voltage generator 2b for nonvolatile memory in the nonvolatile memory 100 having such a structure are described hereinafter in detail with reference to FIG. 4.

The drain voltage generator 2a for nonvolatile memory includes a reference voltage generator 8, a comparator 9, a clock signal generator 10, an arithmetic circuit 11, a booster 12, and a first resistor R1 and a second resistor R2 which constitute a first voltage generator. In this embodiment, a NAND circuit is used as the arithmetic circuit.

The reference voltage generator 8 includes a standard voltage generator 13, a low frequency oscillator 14, and a capacitor C1. The standard voltage generator 13 is a circuit that generates a standard voltage. At this time, an output level of the standard voltage generator 13 varies in synchronization with an oscillation frequency of the low frequency oscillator 14 by changing an output level of the low frequency oscillator 14. Further, the amount of the variation (amplitude) of the output level of the standard voltage generator 13 can be altered by changing the capacitance of the capacitor C1. The capacitor C1 is connected between the output portion of the standard voltage generator 13 and the output portion of the low frequency oscillator 14.

A reference voltage Va which has the amplitude that is generated by the reference voltage generator 8 is input to the non-inverted input terminal of the comparator 9. The inverted input terminal of the comparator 9 is connected with a node (point A) between the first resistor R1 and the second resistor R2. The first resistor R1 and the second resistor R2 are connected in series between an output terminal Vout of the booster 12 and a ground voltage.

Figure 5:
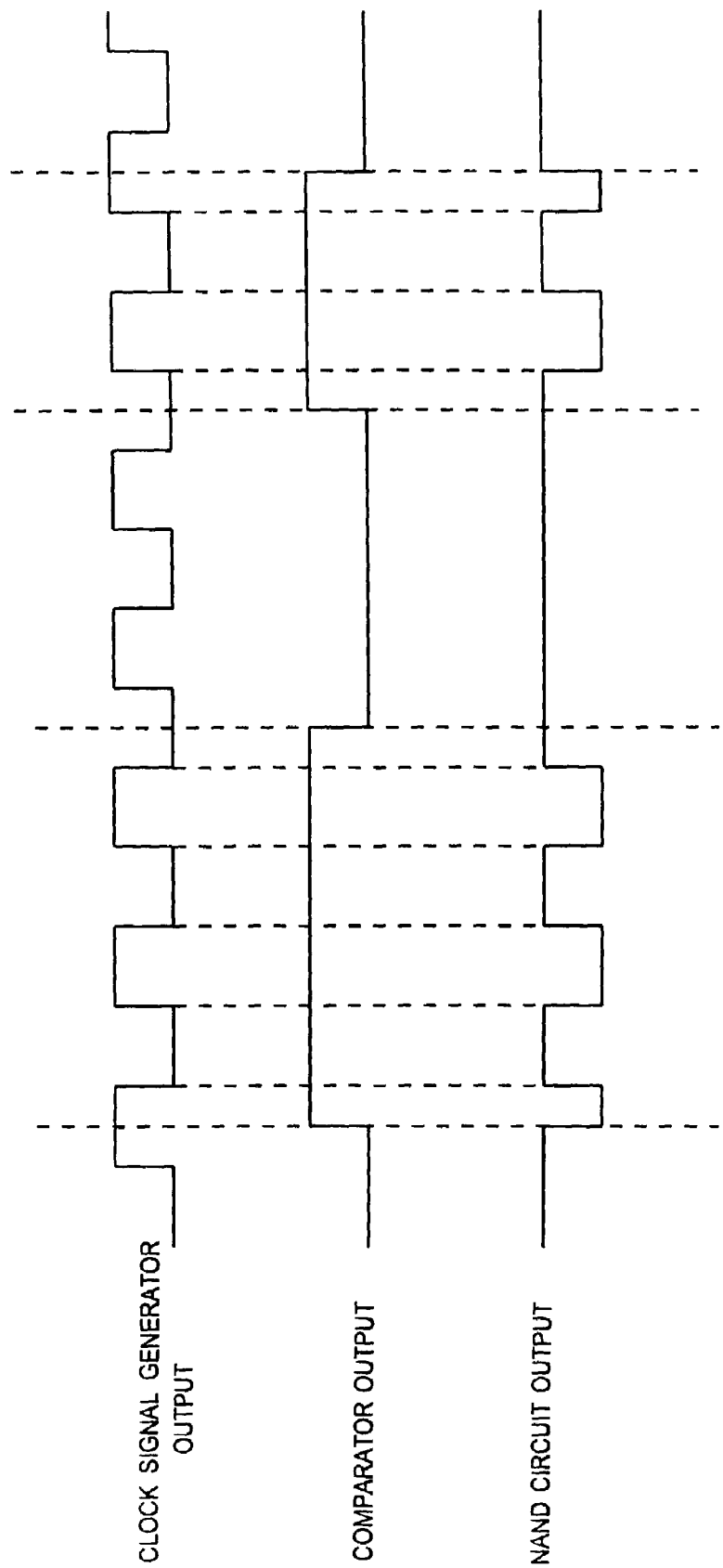
FIG. 5 is a view showing signal waveforms in a drain voltage generator for nonvolatile memory according to the first embodiment.

The comparator 9 compares a voltage at the node between the first resistor R1 and the second resistor R2 (which is referred to hereinafter as a first voltage V1) with the reference voltage Va having a given amplitude and outputs a boost operation control signal, which is a comparison result, to the NAND circuit 11. The NAND circuit 11 outputs a given signal to the booster 12 according to the clock signal which is generated by the clock signal generator 10 and the boost operation control signal which is output from the comparator 9 (cf. FIG. 5).

The booster 12 includes a power supply voltage VDD, a PMOS transistor P1, an NMOS transistor N5, capacitors C2 and C3, and diodes Di1 and Di2. The booster 12 drives the gates of the PMOS transistor P1 and the NMOS transistor N5 according to the signal of "H" level or "L" level which is output from the NAND circuit 11. If the NMOS transistor N5 is ON and the PMOS transistor P1 is OFF in response to the "H" level signal which is output from the NAND circuit 11, a voltage at the power supply voltage VDD-VF (diode forward voltage) is charged to the capacitor C2. If the PMOS transistor P1 is ON and the NMOS transistor N5 is OFF in response to the "L" level signal which is output from the NAND circuit 11, a voltage 2VDD-2VF is generated in the capacitor C3. If the output of the NAND circuit 11 is fixed to "H" level, the booster 12 stops boosting. The booster 12 thereby outputs the voltage which is stepped up from the power supply voltage VDD (2VDD-2VF) to the output terminal Vout.

Figure 7:
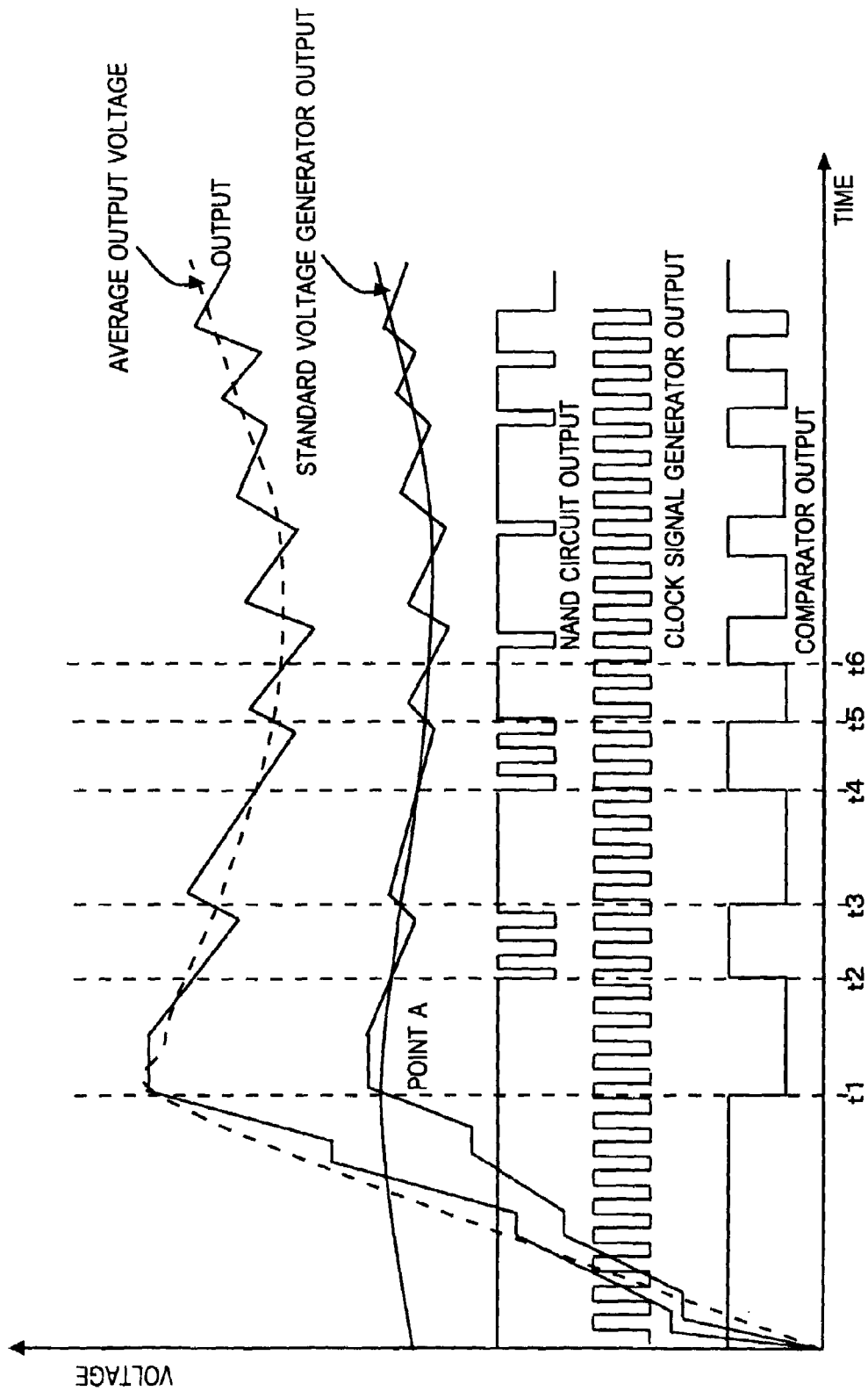
FIG. 7 is a view showing output waveforms of a voltage with a given amplitude from a drain voltage generator for nonvolatile memory according to the first embodiment.

The structure of the gate voltage generator 2b for nonvolatile memory is the same as the structure of the drain voltage generator 2a for nonvolatile memory except for the setting of a resistance ratio between the first resistor R1 and the second resistor R2 and thus not described in detail herein. The operation of the drain voltage generator 2a for nonvolatile memory is described hereinafter with reference to FIG. 4 and the voltage waveform shown in FIG. 7. In the following description, the reference voltage generator 8 outputs a reference voltage with an amplitude of 0.9V±0.1V. Further, the resistance ratio of the first resistor R1 and the second resistor R2 is 4:1.

First, the case where the output voltage of the reference voltage generator 8 which outputs a voltage having a given amplitude is 1.0V, for example, is described hereinafter. Based on the signal which is output from the NAND circuit 11, the output of the booster 12 increases from 0V. When the output of the booster 12 reaches 5.0V, the voltage at the point A is 1.0V, which is equal to the output voltage of the reference voltage generator 8. If the booster 12 keeps boosting, the voltage at the point A becomes higher than 1.0V, and the comparator 9 outputs an "L" level signal (cf. t1 in FIG. 7). The output of the NAND circuit 11 is thereby fixed to "H" level, and therefore the booster 12 stops boosting. In this case, the output voltage of the booster 12 is a level that is slightly higher than 5.0V.

After that, the output voltage of the booster 12 starts decreasing due to the first resistor R1 and the second resistor R2 which are placed in the output portion of the booster 12. When the output voltage of the booster 12 falls below 5.0V, the voltage at the point A becomes lower than 1.0V. Then, the comparator 9 outputs an "H" level signal (cf. t2 in FIG. 7). Thus, the output of the NAND circuit 11 changes in accordance with the amplitude of the clock signal generator 10, and the booster 12 restarts boosting. As a result of repeating such operation, the booster 12 outputs the voltage of about 5.0V to the output terminal Vout when the output voltage of the reference voltage generator 8 which outputs a voltage having a given amplitude is 1.0V.

Next, the case where the output voltage of the reference voltage generator 8 which outputs a voltage having a given amplitude is 0.9V, for example, is described hereinbelow. When the output terminal Vout of the booster 12 reaches 4.5V, the voltage at the point A is 0.9V, which is equal to the output voltage of the reference voltage generator 8. If the booster 12 keeps boosting, the voltage at the point A becomes higher than 0.9V, and the comparator 9 outputs an "L" level signal (cf. t3 in FIG. 7). The output of the NAND circuit 11 is thereby fixed to "H" level, and therefore the booster 12 stops boosting. In this case, the output voltage of the booster 12 is a level that is slightly higher than 4.5V.

After that, the output voltage of the booster 12 starts decreasing due to the first resistor R1 and the second resistor R2 which are placed in the output portion of the booster 12.

When the output voltage of the booster 12 falls below 4.5V, the voltage at the point A becomes lower than 0.9V. Then, the comparator 9 outputs an "H" level signal (cf. t4 in FIG. 7). Thus, the output of the NAND circuit 11 changes in accordance with the amplitude of the clock signal generator 10, and the booster 12 restarts boosting. As a result of repeating such operation, the booster 12 outputs the voltage of about 4.5V to the output terminal Vout when the output voltage of the reference voltage generator 8 which outputs a voltage having a given amplitude is 0.9V.

Finally, the case where the output voltage of the reference voltage generator 8 which outputs a voltage having a given amplitude is 0.8V, for example, is described hereinbelow. When the output voltage of the booster 12 reaches 4.0V, the voltage at the point A is 0.8V, which is equal to the output voltage of the reference voltage generator 8. If the booster 12 keeps boosting, the voltage at the point A becomes higher than 0.8V, and the comparator 9 outputs an "L" level signal (cf. t5 in FIG. 7). The output of the NAND circuit 11 is thereby fixed to "H" level, and therefore booster 12 stops boosting. In this case, the output voltage of the booster 12 is a level that is slightly higher than 4.0V.

After that, the output voltage of the booster 12 starts decreasing due to the first resistor R1 and the second resistor R2 which are placed in the output portion of the booster 12. When the output voltage of the booster 12 falls and becomes below 4.0V, the voltage at the point A becomes lower than 0.8V. Then, the comparator 9 outputs an "H" level signal (cf. t6 in FIG. 7). Thus, the output of the NAND circuit 11 changes in accordance with the amplitude of the clock signal generator 10, and the booster 12 restarts boosting. As a result of repeating such operation, the booster 12 outputs the voltage of about 4.0V to the output terminal Vout when the output voltage of the reference voltage generator 8 which outputs a voltage having a given amplitude is 0.8V.

As described above, the drain voltage generator 2a for nonvolatile memory converts a voltage with a small amplitude and outputs a voltage with a larger amplitude. Specifically, when the reference voltage generator 8 outputs the voltage having the amplitude of 0.9V±0.1V, the booster 12 outputs an applied voltage having the amplitude of 4.5V±0.5V. In the gate voltage generator 2b for nonvolatile memory, the ratio of the first resistor R1 and the second resistor R2 is set to 5.11:1. In the gate voltage generator 2b for nonvolatile memory, the booster 12 outputs an applied voltage having the amplitude of 5.5V±0.5V when the reference voltage generator 8 outputs the voltage having the amplitude of 0.9V±0.1V.

Figure 3:
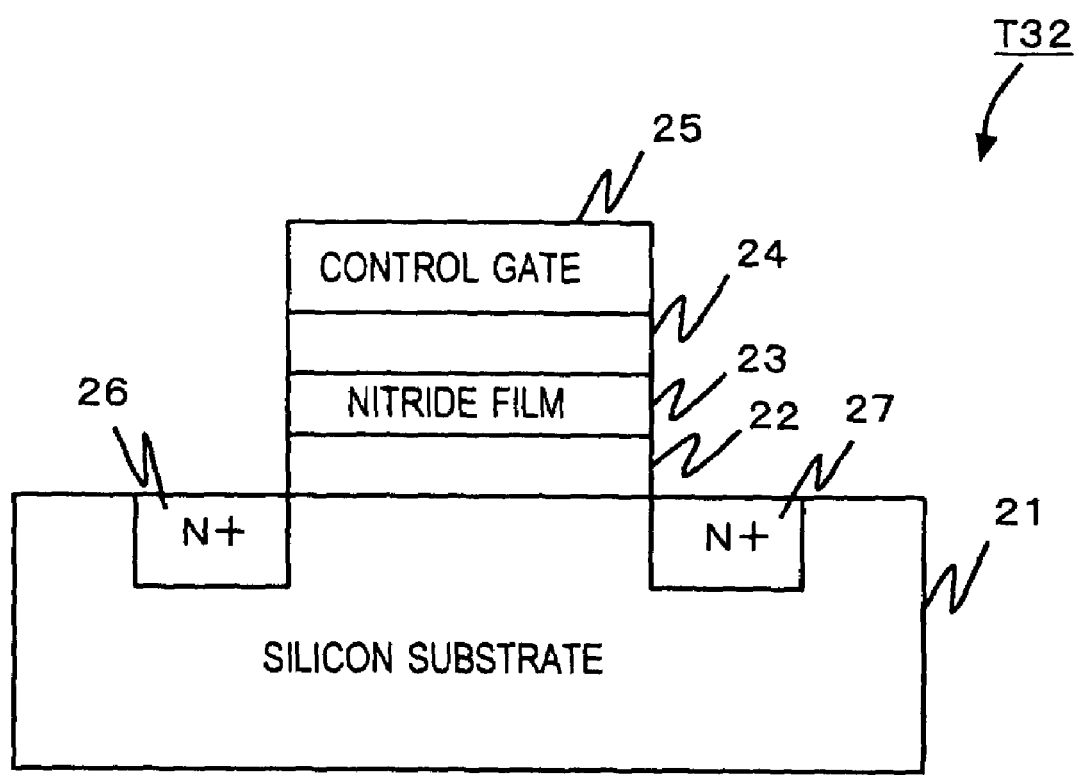
FIG. 3 is a view showing a memory cell transistor according to the first embodiment.

The drain voltage and the gate voltage which are generated in this manner are applied to the drain electrode and the gate electrode in the memory cell transistor, respectively. FIG. 3 is a view showing the cross section of a given memory cell transistor (e.g. the memory cell transistor T32) in the plurality of memory cell transistors. The memory cell transistor T32 includes a substrate 21, a first insulating film 22, a dielectric film 23, a second insulating film 24, and a control gate electrode 25. In this embodiment, the substrate is a silicon substrate, and the dielectric film is a nitride film. In the silicon substrate 21, a source diffusion region 26 and a drain diffusion region 27 are formed. The first insulating film 22 is formed on the silicon substrate 21. The nitride film 23 is formed as a floating gate on the first insulating film 22, and the second insulating film 24 is formed on the nitride film 23. The control gate electrode 25 is formed on the second insulating film 24.

Figure 8:
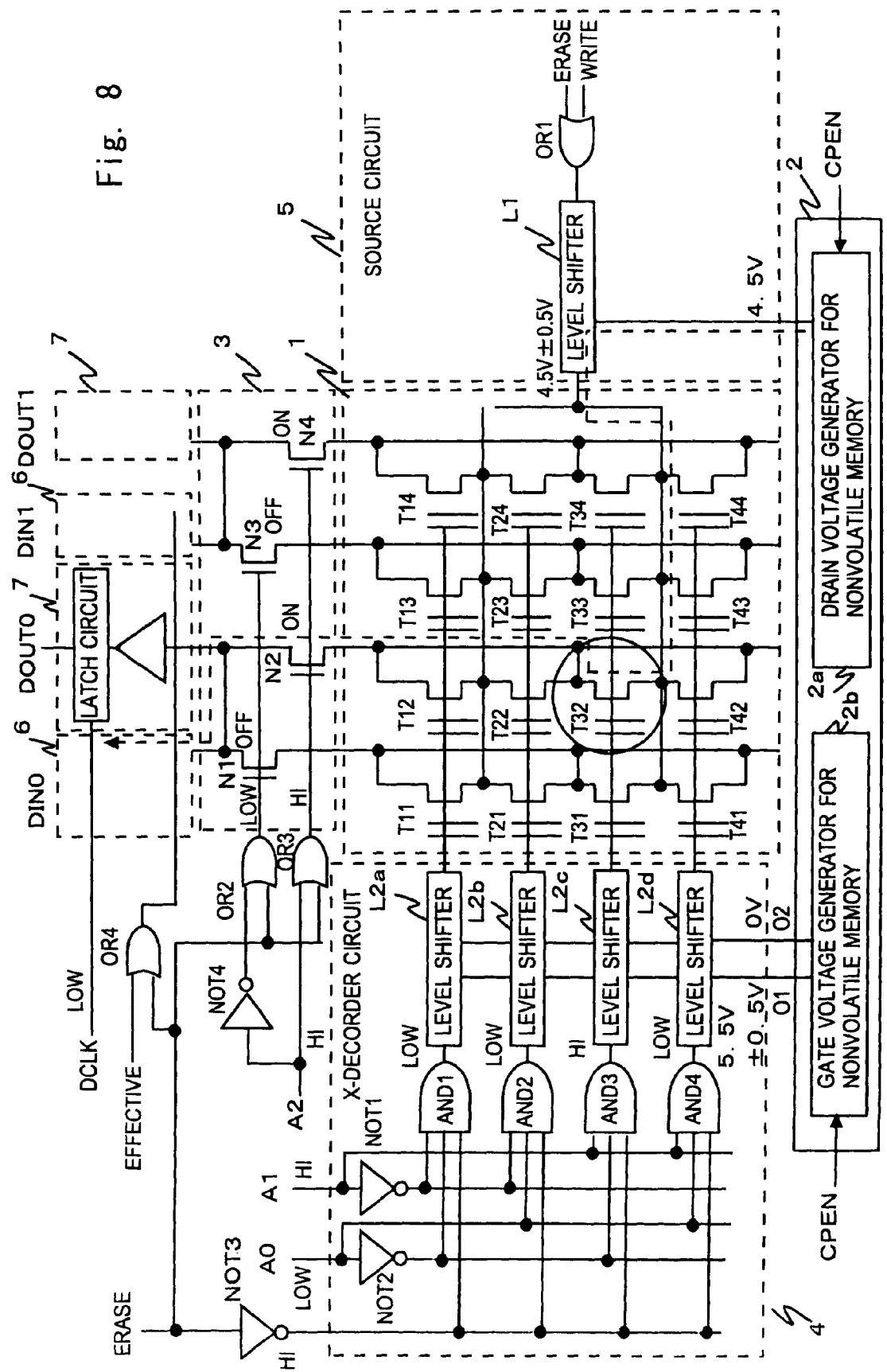
FIG. 8 is a view showing a nonvolatile memory during writing according to the first embodiment.

Referring to FIG. 8 and the timing chart of FIG. 9, write operation is described hereinafter. First, the case where voltages with given amplitudes are applied to both of the drain electrode and the gate electrode is described hereinafter. The application of the voltages having such amplitudes are performed in one-time writing.

For example, the voltages with the amplitudes of 5.5V±0.5V and 4.5V±0.5V are applied to the gate electrode and the drain electrode, respectively. First, the booster enable signal CPEN is switched from "L" level to "H" level, and the drain voltage generator 2a for nonvolatile memory and the gate voltage generator 2b for nonvolatile memory start the boost operation (cf. t1 in FIG. 9). In the state where the drain voltage generator 2a for nonvolatile memory and the gate voltage generator 2b for nonvolatile memory output the amplitude voltages, the actual write signal Effective is switched from "L" level to "H" level (cf. t2 in FIG. 9). For example, in the write operation on the memory cell transistor T32, the address signals A0 and A1 are set to "L" level and "H" level, respectively. Then, the AND circuits AND1 to AND4 output the signals of "L", "L", "H", "L" levels, respectively. Thus, according to the input of the "H" level signal, the level shifter L2c supplies the gate voltage of 5.5V±0.5V to the gate electrodes of the transistors T31 to T34. On the other hand, the address signal A2 is set as an "H" level signal. Then, the NMOS transistor N2 in the selector 3 turns ON, and the write circuit 6 becomes connected with the source of the memory cell transistor T32. In this manner, the signals of "L", "H", "H" levels are input to the address terminals A0, A1 and A2, respectively, thereby selecting the memory cell transistor T32. Further, the drain voltage of 4.5V±0.5V which is output from the level shifter L1 is applied to the drain electrode of the memory cell transistor T32.

Figure 6:
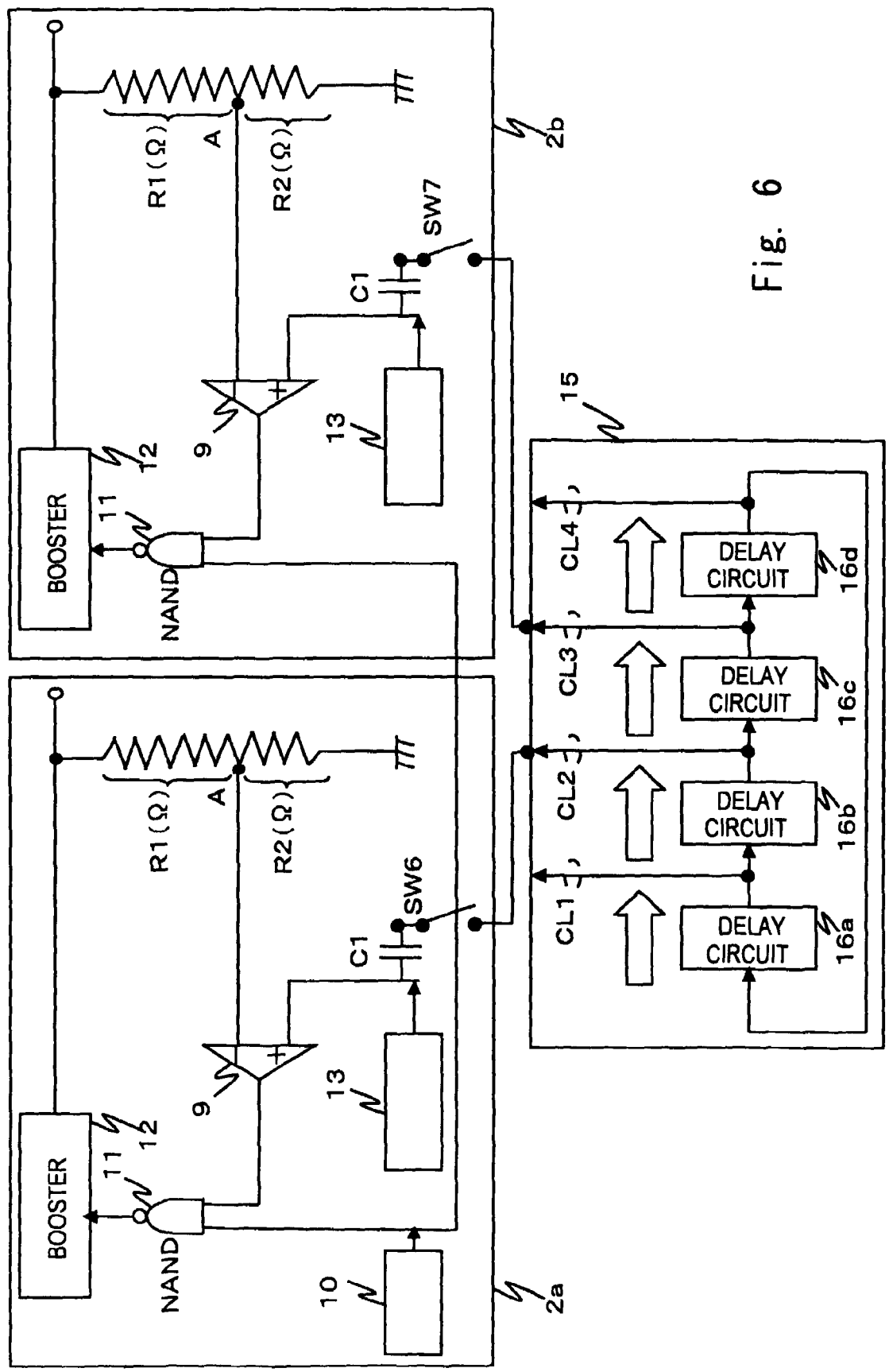
FIG. 6 is a view showing a drain voltage generator for nonvolatile memory and a gate voltage generator for nonvolatile memory according to the first embodiment.

When applying voltages with given amplitudes to both of the drain electrode and the gate electrode of the memory cell transistor T32, the phases of a drain voltage and a gate voltage preferably differ in order to trap electrons uniformly in a nitride film. FIG. 6 shows the voltage generator for nonvolatile memory which generates a drain voltage and a gate voltage having a phase difference of 90°.

Referring to FIG. 6, clock signals CL2 and CL3 which are output from a low frequency oscillator 15 are respectively connected through switches SW6 and SW7 to the capacitors Cl which are placed in the drain voltage generator 2a for nonvolatile memory and the gate voltage generator 2b for nonvolatile memory. The low frequency oscillator 15 includes a first delay circuit 16a to a fourth delay circuit 16d. The clock signal CL1 which is generated by the first delay circuit 16a is input to a second delay circuit 16b. According to the input of the first clock signal CL1, the second delay circuit 16b outputs a second clock signal CL2 which has a phase difference of 90° from the first clock signal CL1 to a third delay circuit 16c. In this manner, the clock signal CL2 which is output from the second delay circuit 16b and the clock signal CL3 which is output from the third delay circuit 16c are input to the capacitor C1 in the drain voltage generator 2a for nonvolatile memory and the capacitor C1 in the gate voltage generator 2b for nonvolatile memory, respectively. The switch SW6 and the switch SW7 are in the ON state.

Figure 10A:
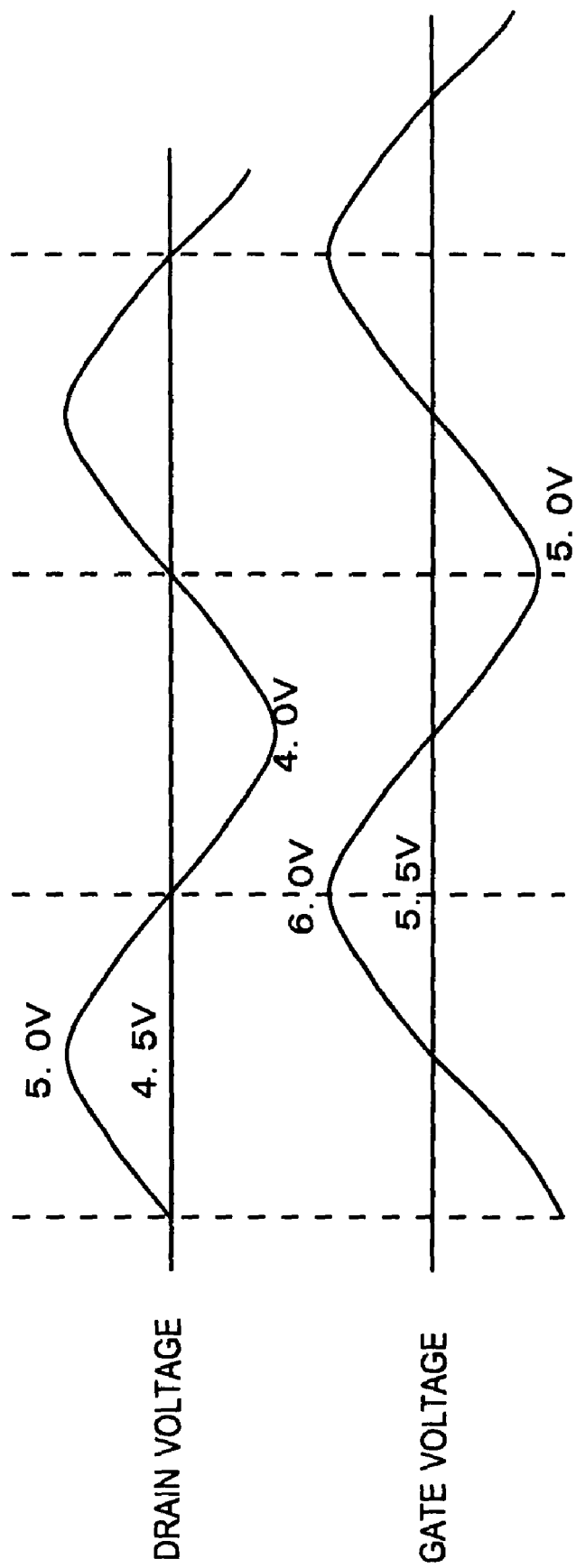
FIGS. 10A and 10B are views showing waveforms of a drain voltage and a gate voltage each having a given amplitude according to the first embodiment.
Figure 10B:
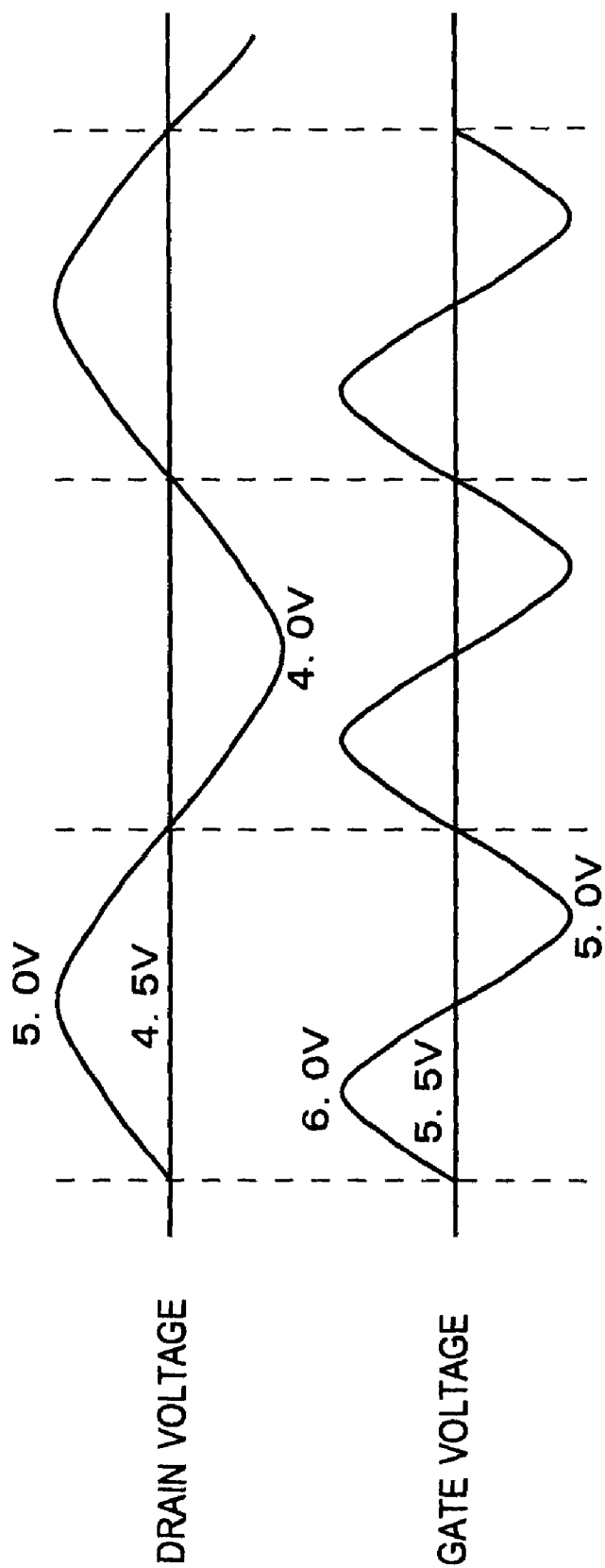

The second clock signal CL2 and the third clock signal CL3 having a phase difference of 90° are thereby input to the drain voltage generator 2a for nonvolatile memory and the gate voltage generator 2b for nonvolatile memory, respectively. Then, in synchronization with the second clock signal CL2 and the third clock signal CL3, the drain voltage and the gate voltage having a phase difference of 90° are output from the drain voltage generator 2a for nonvolatile memory and the gate voltage generator 2b for nonvolatile memory, respectively (cf. FIG. 10A). Although the case of applying the voltages having a phase difference of 90° is described in this embodiment, the voltages having an amplitude with a different periodicity may be applied to each of the drain electrode and the gate electrode (cf. FIG. 10B).

Figure 11:
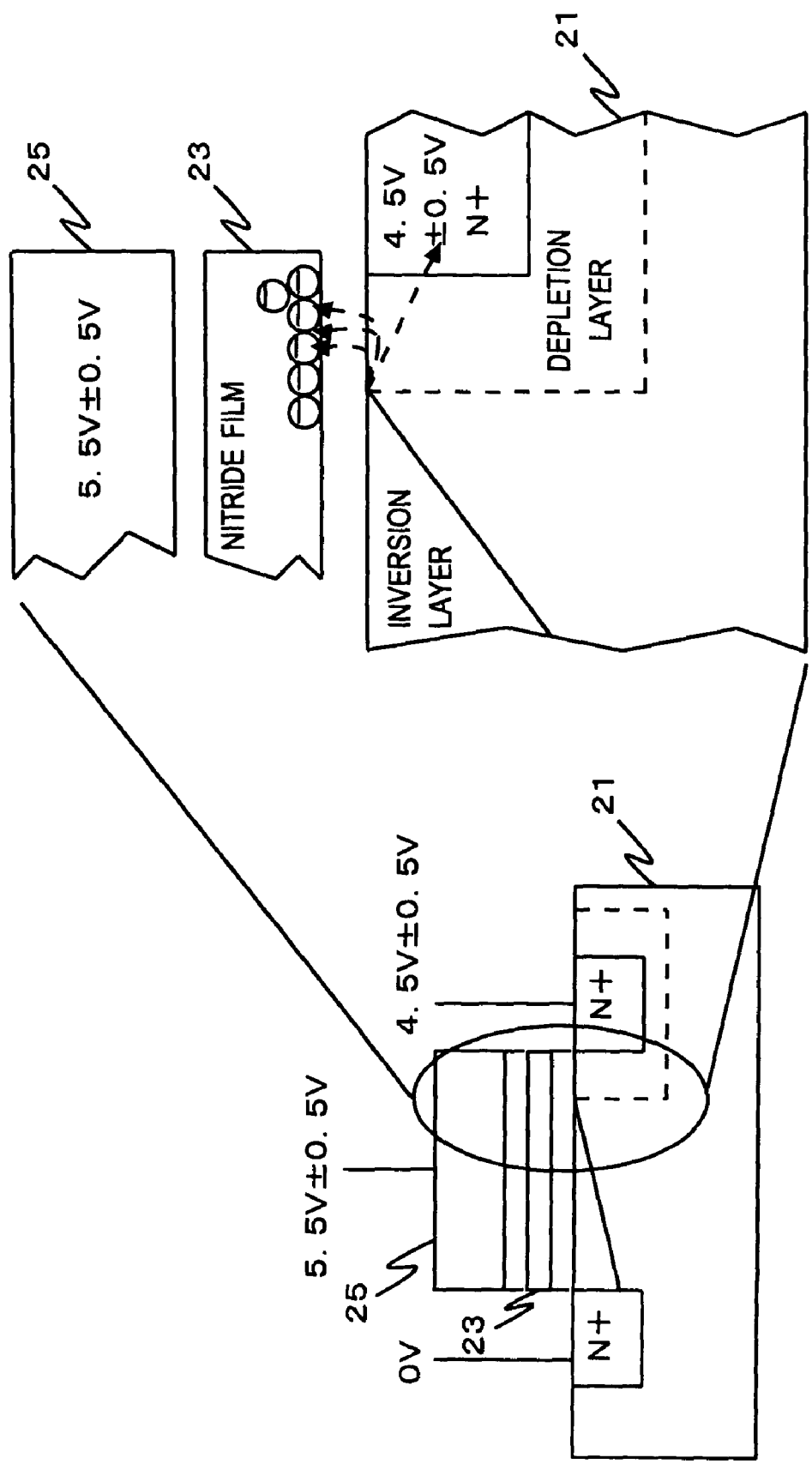
FIG. 11 is a view showing a MONOS memory during writing according to the first embodiment.

In this way, the voltages with the amplitudes of 4.5V±0.5V and 5.5V±0.5V are applied to the drain electrode and the gate electrode, respectively (cf. FIG. 11). When the drain voltage has the amplitude of 4.5V±0.5V, the width of the depletion layer changes. The depletion layer extends toward the source region as the drain voltage is higher. Accordingly, the position where hot electrons are generated changes. Further, when the gate voltage has the amplitude of 5.5V±0.5V, the velocity of the electrons which are injected into the nitride film 23 changes.

Figure 12:
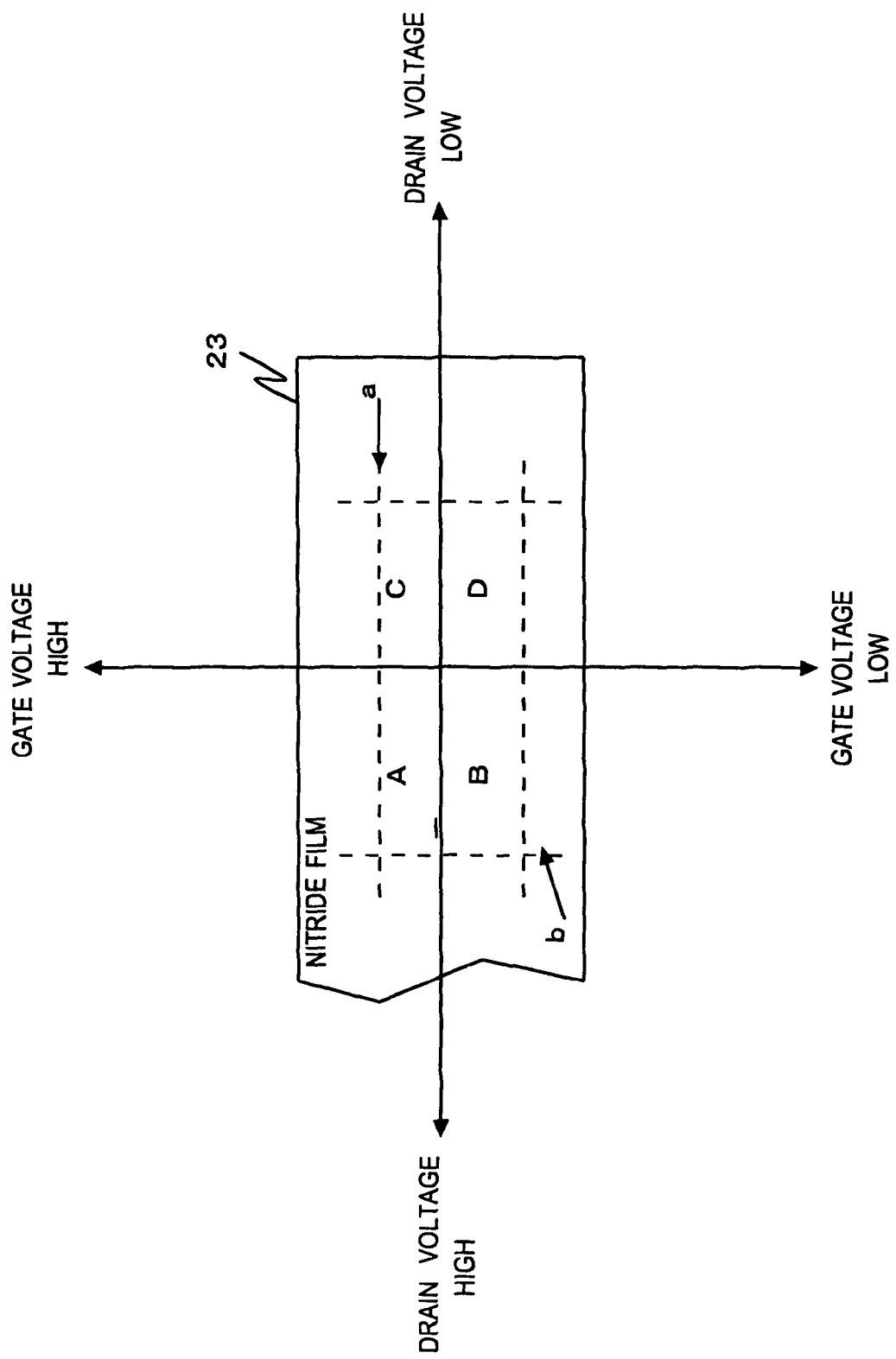
FIG. 12 is a sectional view of a nitride film during writing according to the first embodiment.

For example, when the drain voltage and the gate voltage are 5.0V and 6.0V, respectively, the electrons are trapped in the vicinity of the region A of the nitride film 23 (cf. FIG. 12). When the drain voltage and the gate voltage are 4.0V and 5.0V, respectively, the electrons are trapped in the vicinity of the region D of the nitride film 23 (cf. FIG. 12).

Figure 13:
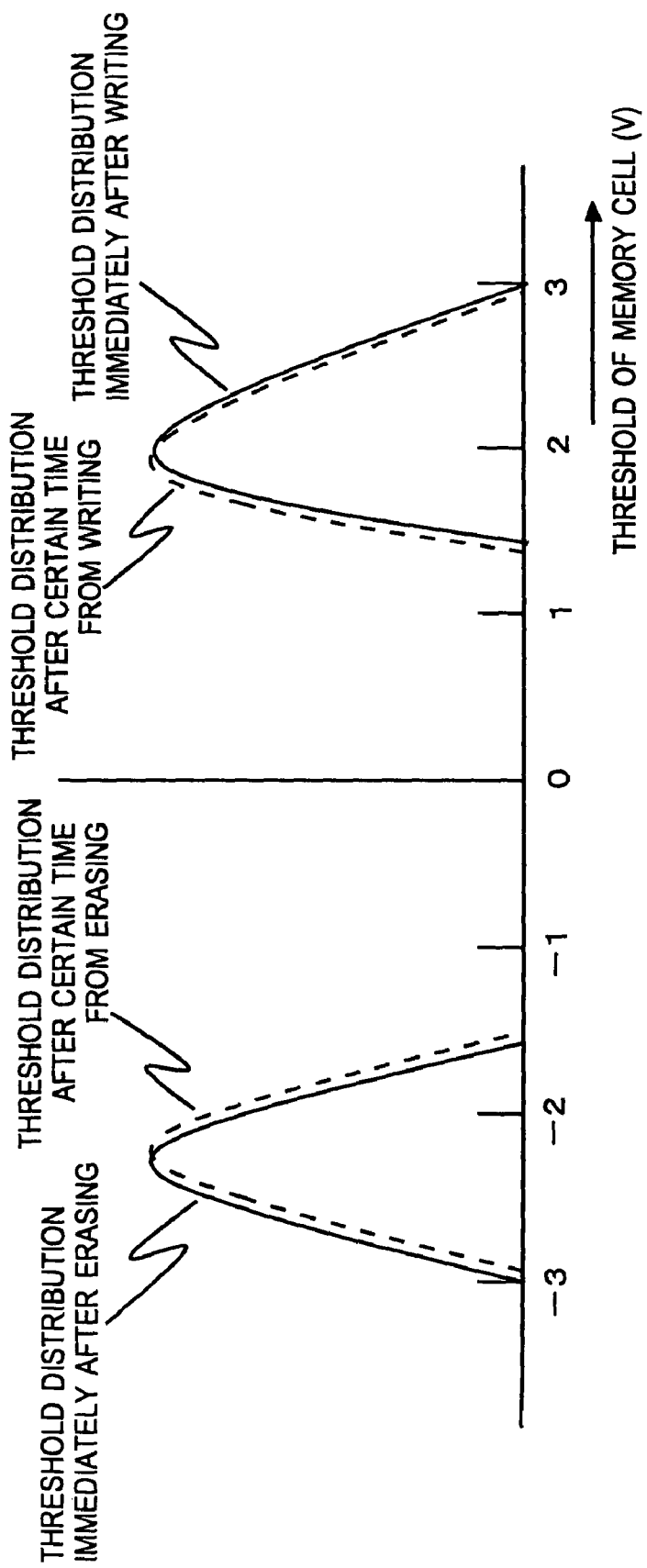
FIG. 13 is a view showing a change in a threshold of a memory cell transistor during writing and erasing according to the first embodiment.

As described above, the positions of the electrons which are trapped in the nitride film 23 can be adjusted appropriately depending on the levels of the gate voltage and the drain voltage. The positions of the electrons which are trapped in the nitride film 23 thereby become uniform. It is therefore possible to minimize a difference between the threshold immediately after writing and the threshold after a certain period of time from writing (cf. FIG. 13).

Figure 9:
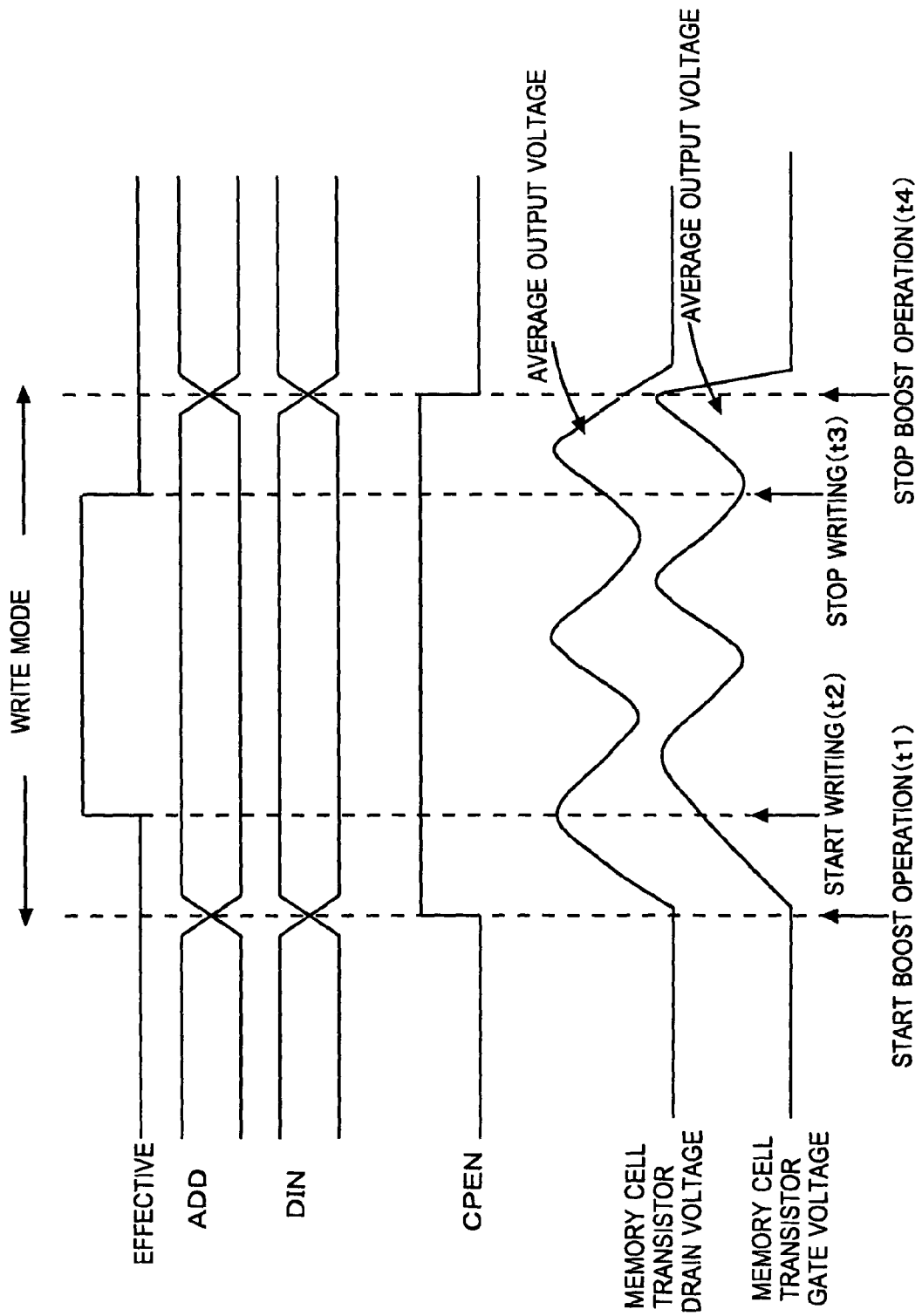
FIG. 9 is a view showing a timing chart during writing according to the first embodiment.

After that, the actual write signal Effective which is input to the write circuit 6 is switched to "L" level, thereby stopping the write operation (t3 in FIG. 9). Further, the booster enable signal CPEN which is input to the drain voltage generator 2a for nonvolatile memory and the gate voltage generator 2b for nonvolatile memory is switched to "L" level, thereby stopping the boost operation (t4 in FIG. 9). As described above, the write operation is executed by applying voltages having given amplitudes to the gate electrode and the drain electrode.

Figure 14:
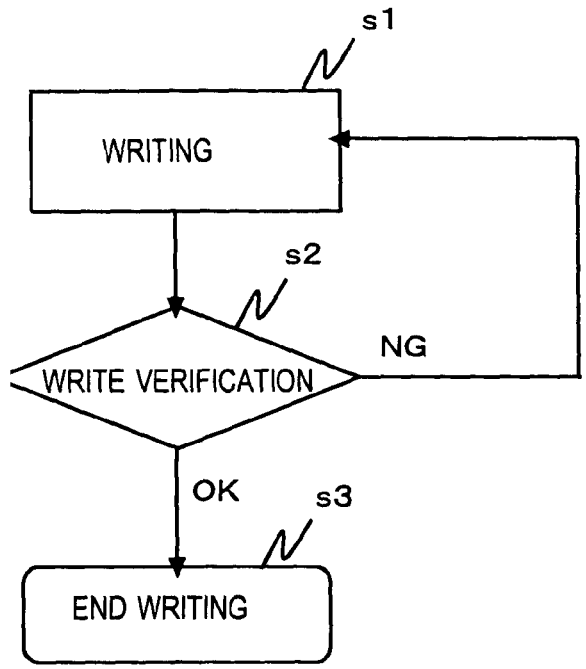
FIG. 14 is a view showing a process flow of write verification according to the first embodiment.

After the electrons are written into the nitride film 23, write verification is performed in order to verify whether writing to the memory cell array 1 is performed appropriately. FIG. 14 shows a process flow of the write verification. After the writing to the memory cell transistor T32 is performed (s1 in FIG. 14), the write verification is executed (s2 in FIG. 14).

Figure 15:
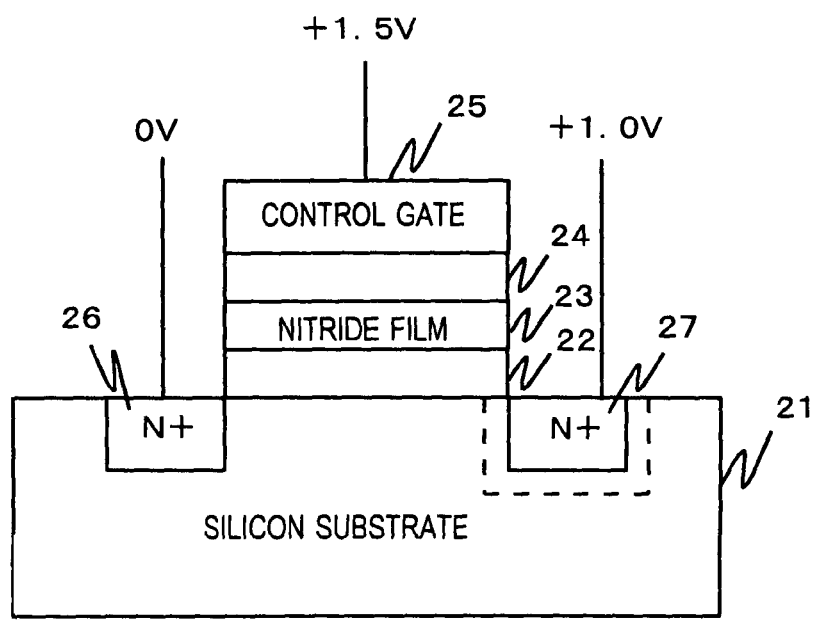
FIG. 15 is a view showing voltage application to a memory cell transistor during write verification according to the first embodiment.
Figure 16:
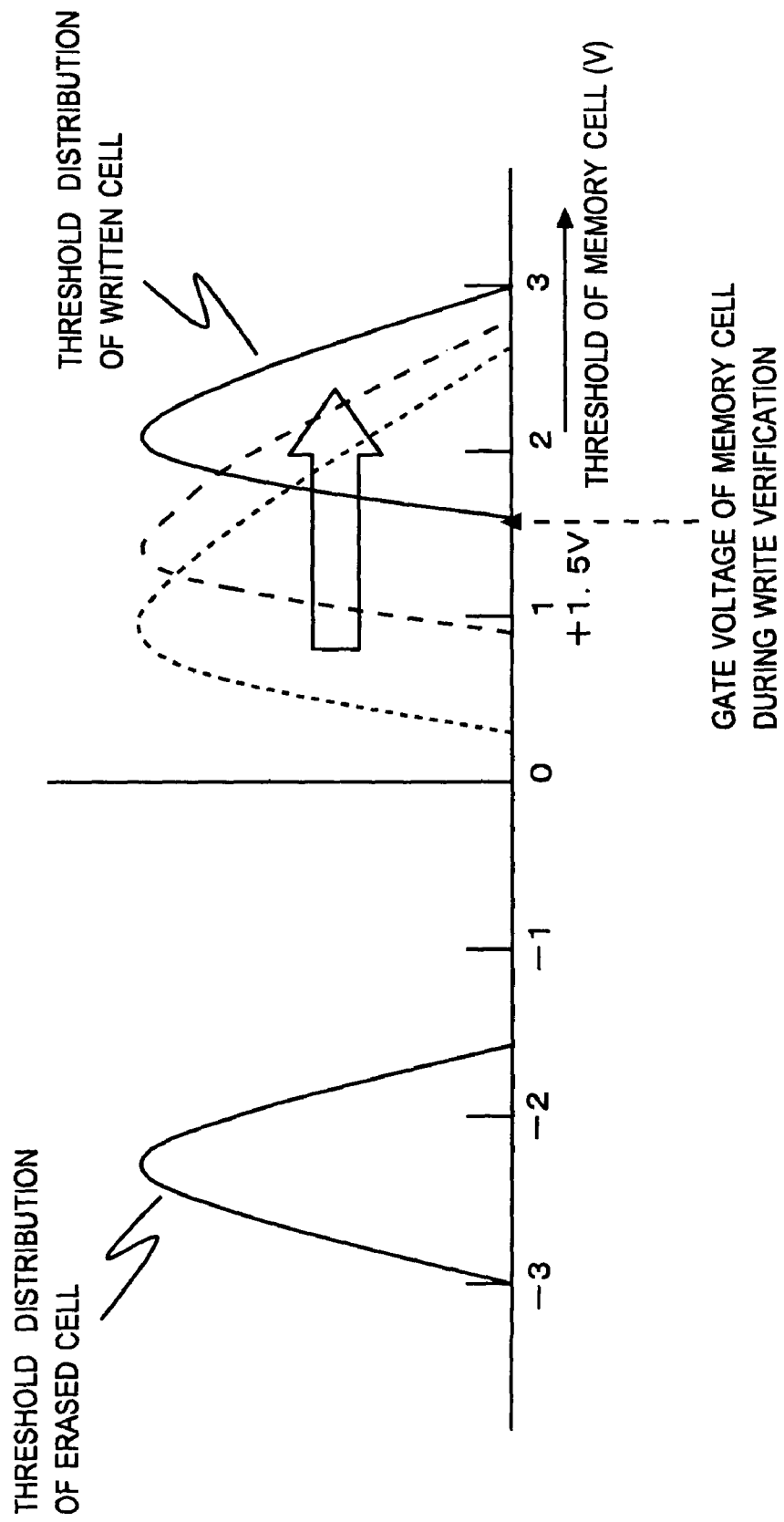
FIG. 16 is a view showing threshold distribution in a memory cell transistor during writing according to the first embodiment.

The case of applying the gate voltage of 1.5V to the memory cell transistor T32 is described as an example of the write verification with reference to FIGS. 15 and 16. When the threshold of the memory cell transistor is lower than 1.5V (cf. FIG. 16), the memory cell is in the ON state, so that current flows between the source and the drain. In this case, the process determines that writing is not yet completed and performs writing again (s1 in FIG. 14). On the other hand, when the threshold of the memory cell transistor is higher than 1.5V (cf. FIG. 16), the memory cell is in the OFF state, so that current ceases to flow. In this case, the process determines that writing is completed normally and thereby ends writing (s3 in FIG. 14).

As described above, the positions of the electrons which are trapped in the nitride film 23 can become uniform by applying the voltages with given amplitudes to the drain electrode and the gate electrode. It is therefore possible to minimize a difference between the threshold immediately after writing and the threshold after a certain period of time from writing.

Next, the case of varying a voltage which is applied to either one of the gate electrode or the drain electrode is described hereinbelow. The operation of the drain voltage generator 2a for nonvolatile memory and the gate voltage generator 2b for nonvolatile memory is the same as that when applying the voltage having a given amplitude to the gate electrode and the drain electrode and thus not described in detail herein. For example, a fixed voltage of 6.0V and a voltage with an amplitude of 4.5V±0.5V are applied to the gate electrode and the drain electrode, respectively. In the case of applying a fixed voltage to the gate electrode, it is possible to output the fixed voltage of 6.0V by stopping the oscillation of the low frequency oscillator 14 in the gate voltage generator 2b for nonvolatile memory. Further, in the case of using the voltage generator for nonvolatile memory shown in FIG. 6, the switch SW6 is turned ON, and the switch SW7 is turned OFF. In this condition, a voltage with a given amplitude is output from the drain voltage generator 2a for nonvolatile memory, and a fixed voltage is output from the gate voltage generator 2b for nonvolatile memory.

When the drain voltage has the amplitude of 4.5V±0.5V, the width of the depletion layer changes. The depletion layer extends toward the source region as the drain voltage is higher. Accordingly, the position where hot electrons are generated changes. Further, because the gate voltage is a fixed voltage of 6.0V, the velocity of the electrons which are injected into the nitride film 23 is constant. In the case of applying the fixed voltage of 6.0V to the gate electrode and the voltage with the amplitude of 4.5V±0.5V to the drain electrode, the electrons are trapped on the line indicated by a (cf. FIG. 12).

Next, the case of applying the voltage with the amplitude of 5.5V±0.5V and the fixed voltage of 5.0V to the gate electrode and the drain electrode, respectively, is described hereinbelow. The circuit operation is the same as that when applying the fixed voltage to the drain electrode and the voltage with a given amplitude to the gate electrode and thus not described in detail herein. When the gate voltage has the amplitude of 5.5V±0.5V, the velocity of the electrons injected into the nitride film 23 changes. Thus, when the voltage having the amplitude of 5.5V±0.5V and the fixed voltage of 5.0V are applied to the gate electrode and the drain electrode, respectively, the electrons are trapped on the line indicated by b (cf. FIG. 12). As described above, in the case where a voltage which is applied to either one of the gate electrode or the drain electrode is varied, the electrons are trapped on the line of the nitride film 23.

As described in the foregoing, when applying the voltage with a given amplitude to either one of the drain electrode or the gate electrode during writing, the positions of the electrons which are trapped in the nitride film 23 become uniform. It is therefore possible to minimize a difference between the threshold immediately after writing and the threshold after a certain period of time from writing.

Figure 17:
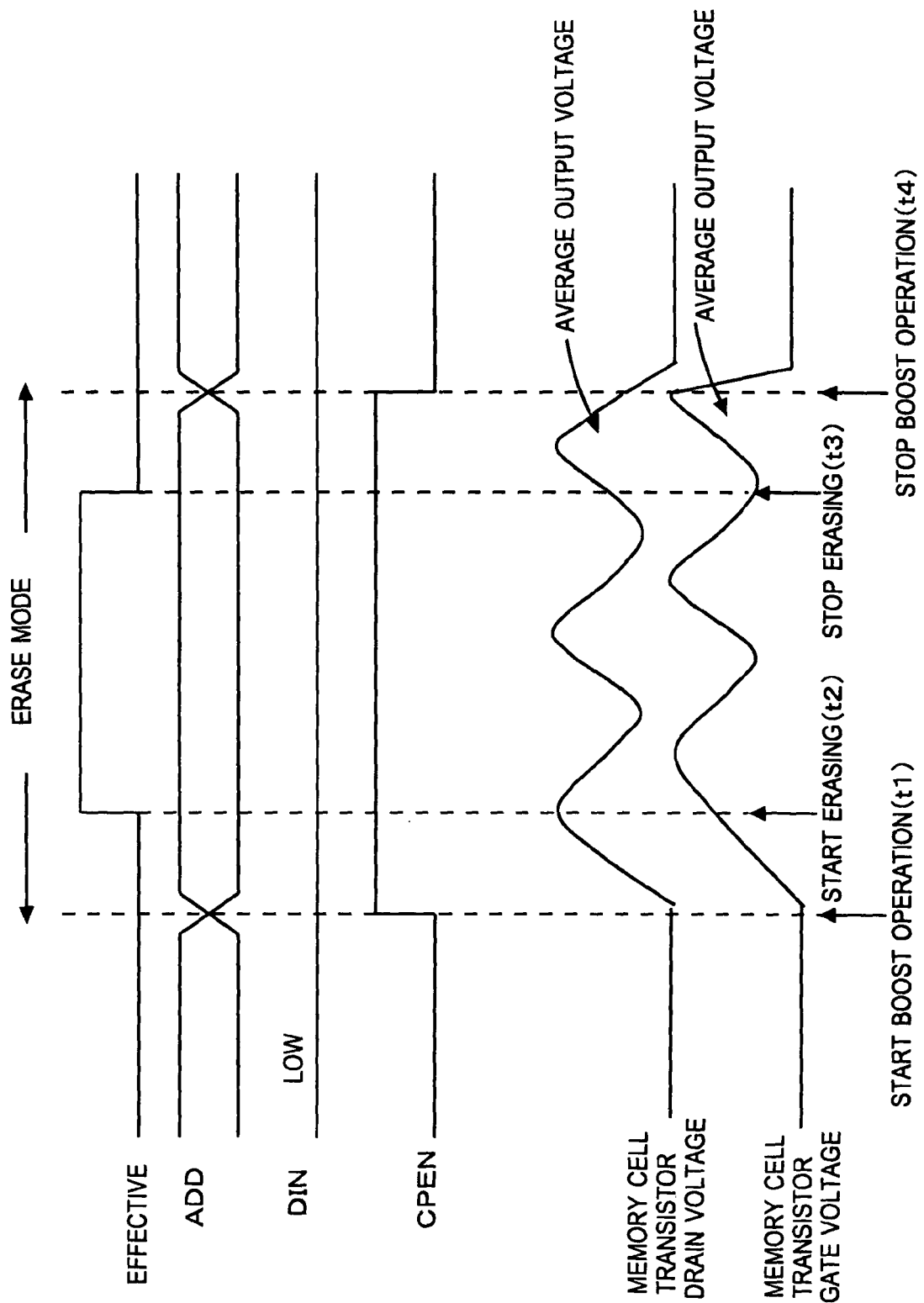
FIG. 17 is a view showing a timing chart during erasing according to the first embodiment.

Referring then to the timing chart of FIG. 17, erase operation is described hereinafter. In the case of applying voltages with given amplitudes to the drain electrode and the gate electrode is described below. In the erase operation, the input/output of control signals and the way of generating voltages with amplitudes having a phase difference of 90° are the same as those described in conjunction with the write operation and thus not described herein. The application of the voltages having such amplitudes is performed in one-time erasing. In the erase operation, erasing is performed at once by applying voltages to the gate electrodes and the drain electrodes of all the memory cell transistors in the memory cell array 1.

Figure 18:
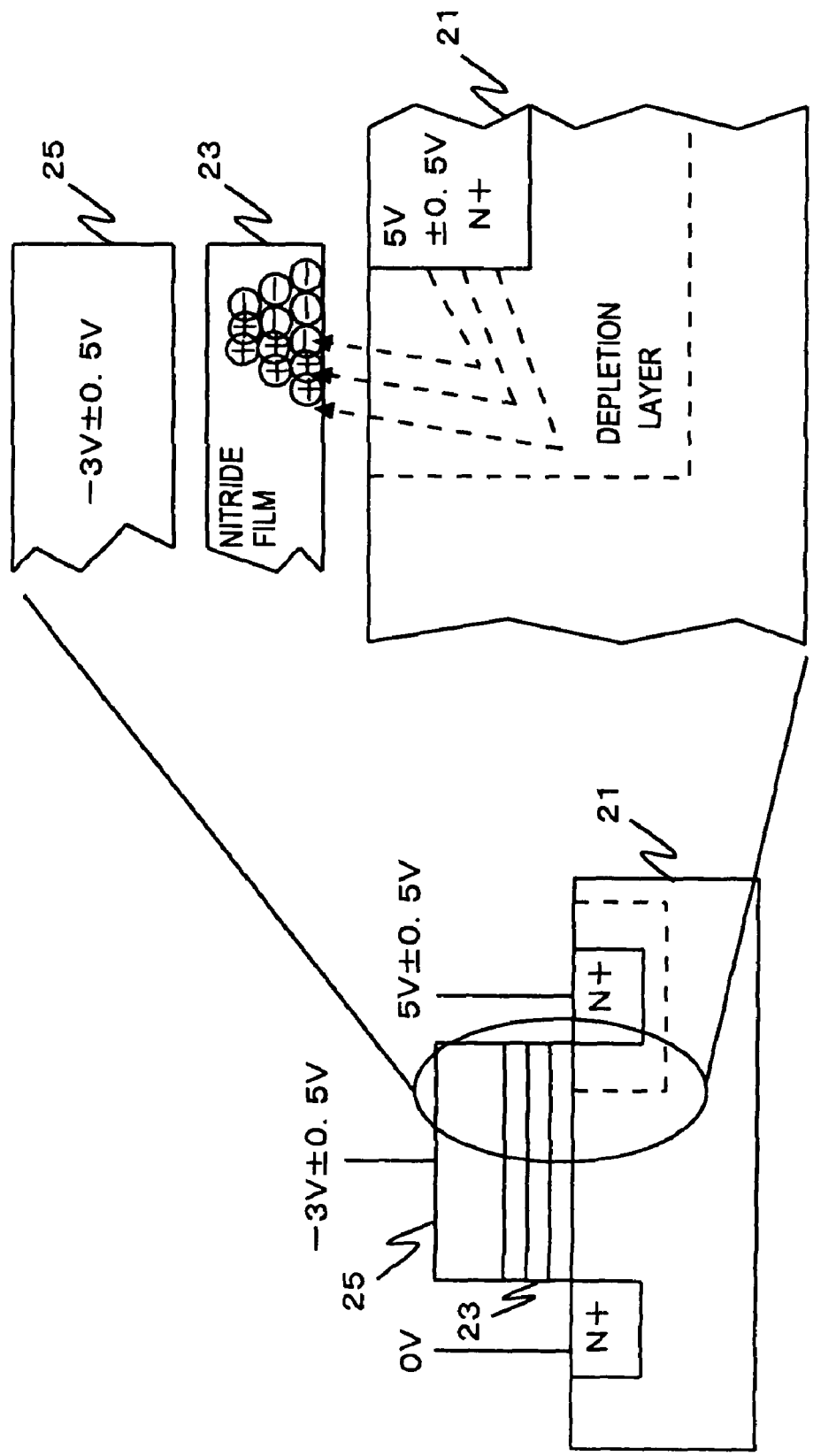
FIG. 18 is a view showing a MONOS memory during erasing according to the first embodiment.

For example, the voltages with the amplitudes of 5.0V±0.5V and −3.0V±0.5V are applied to the drain electrode and the gate electrode, respectively (cf. FIG. 18). When the drain voltage has the amplitude of 5.0V±0.5V, the width of the depletion layer changes. The depletion layer extends toward the source region as the drain voltage is higher. Accordingly, the position where hot holes are generated changes. Further, when the gate voltage has the amplitude of −3.0V±0.5V, the velocity of the hot holes which are injected into the nitride film 23 changes.

Figure 19:
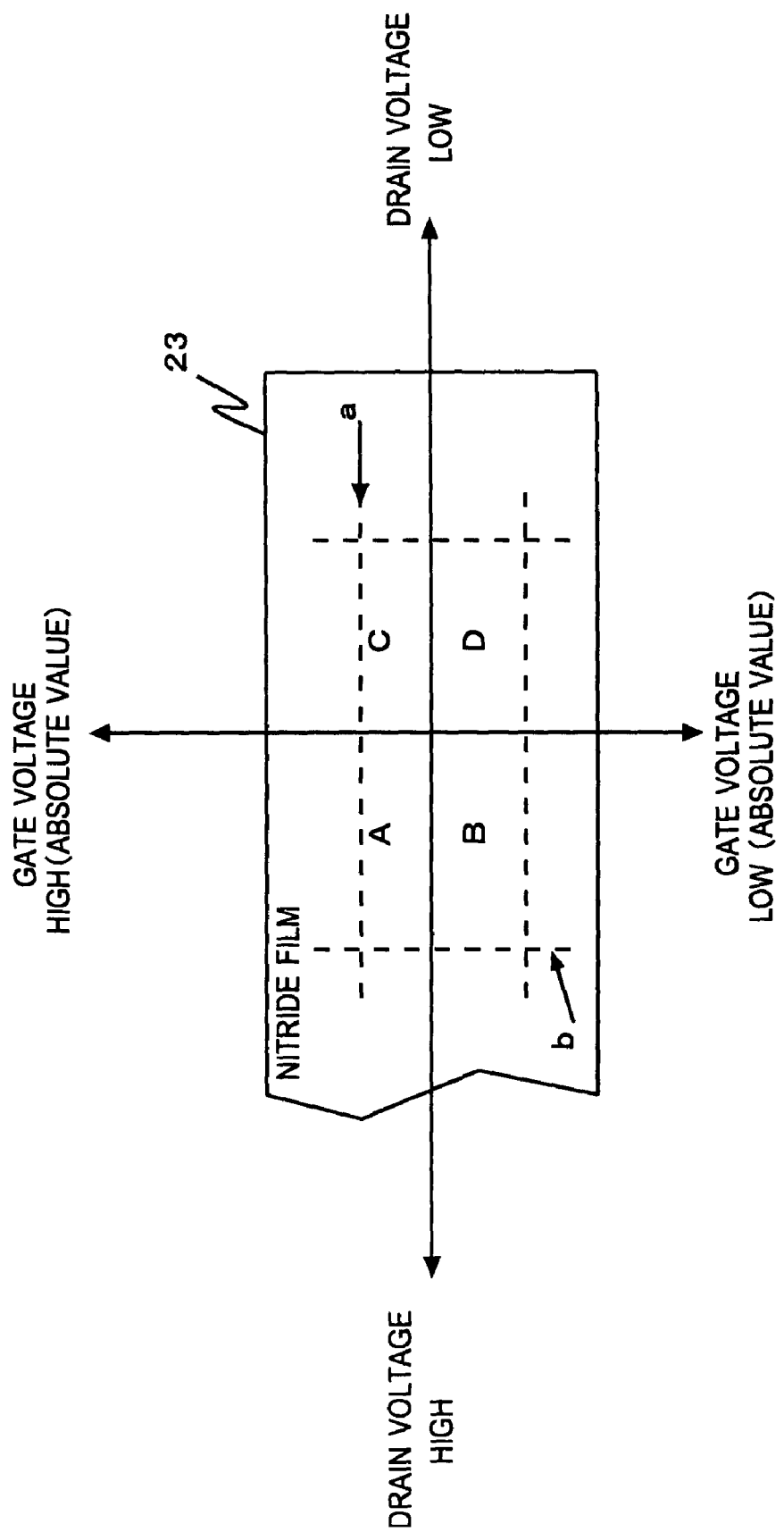
FIG. 19 is a sectional view of a nitride film during erasing according to the first embodiment.

FIG. 19 shows the cross section of the nitride film 23. When the gate voltage (in the absolute value) is high (−3.5V) and the drain voltage is high (+5.5V), the holes are injected into the region A of the nitride film 23. When the gate voltage (in the absolute value) is low (−2.5V) and the drain voltage is low (+4.5V), the holes are injected into the region D of the nitride film 23. In this way, the positions of the holes which are injected into the nitride film 23 can be adjusted appropriately depending on the levels of the gate voltage and the drain voltage. The positions of the holes which are injected into the nitride film 23 thereby become uniform. It is therefore possible to minimize a difference between the threshold immediately after erasing and the threshold after a certain period of time from erasing (cf. FIG. 13).

Figure 20:
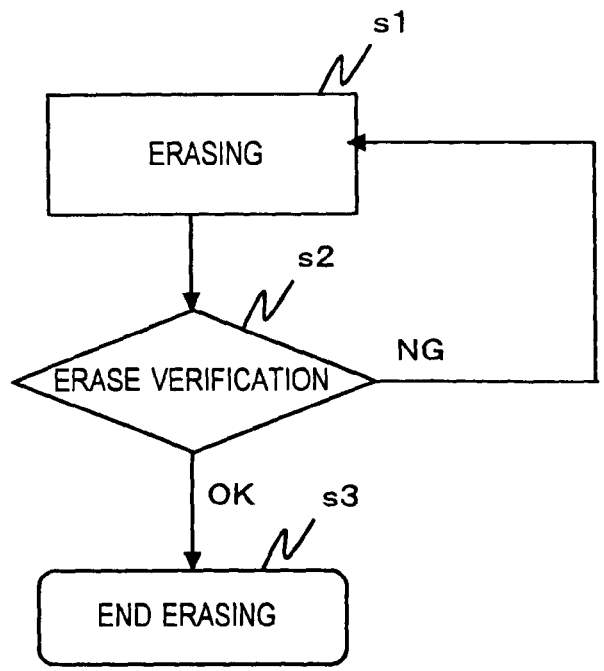
FIG. 20 is a view showing a process flow of erase verification according to the first embodiment.

After erasing, erase verification is performed in order to verify whether erasing is performed appropriately in the memory cell array 1. FIG. 20 shows a process flow of the erase verification. After the erasing of the memory cell is performed (s1 in FIG. 20), the erase verification is executed (s2 in FIG. 20).

Figure 21:
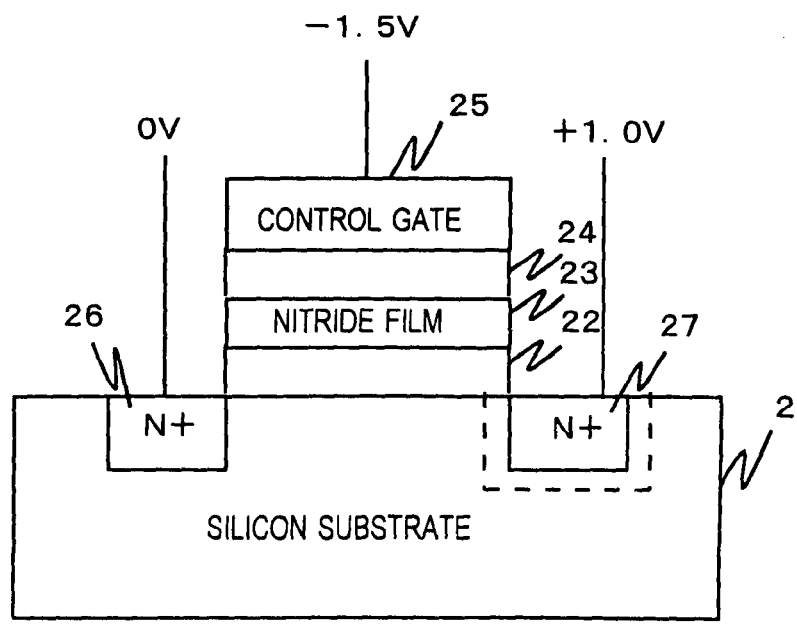
FIG. 21 is a view showing voltage application to a memory cell transistor during erase verification according to the first embodiment.
Figure 22:
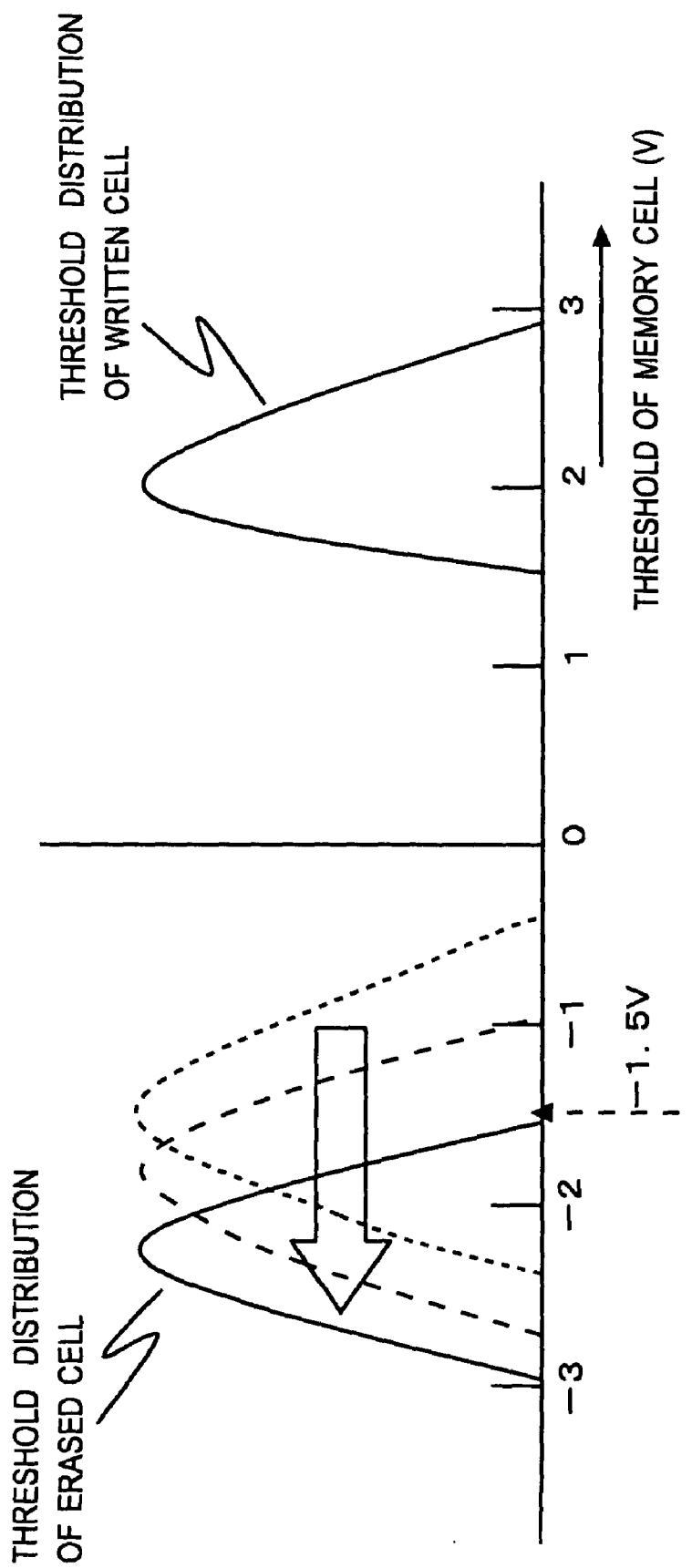
FIG. 22 is a view showing threshold distribution in a memory cell transistor during erase verification according to the first embodiment.

The case of applying the gate voltage of 1.5V to the memory cell transistor T32 is described as an example of the erase verification with reference to FIGS. 21 and 22. When the threshold of the memory cell transistor T32 is higher than −1.5V (cf. FIG. 22), the memory cell transistor T32 is in the OFF state, so that current does not flow between the source and the drain. In this case, the process determines that erasing is not yet completed and performs erasing again (s1 in FIG. 20). On the other hand, when the threshold of the memory cell transistor T32 is lower than −1.5V (cf. FIG. 22), the memory cell transistor T32 is in the ON state, so that current flows between the source and the drain. In this case, the process determines that erasing is completed normally and thereby ends erasing (s3 in FIG. 20).

As described above, the positions of the hot holes which are trapped in the nitride film 23 can become uniform by applying the voltages with given amplitudes to the drain electrode and the gate electrode. It is therefore possible to minimize a difference between the threshold immediately after erasing and the threshold after a certain period of time from erasing. Alternatively, a voltage with a given amplitude may be applied to either one of the drain electrode or the gate electrode.

In the case of erasing, just like during writing, a voltage which is applied to either one of the gate electrode or the drain electrode may be varied. For example, a fixed voltage of −3.0V and a voltage with an amplitude of 5.0V±0.5V may be applied to the gate electrode and the drain electrode, respectively. Then, the electrons are trapped on the line indicated by a (cf. FIG. 12). On the other hand, a voltage with an amplitude of −3V±0.5V and a fixed voltage of 5.5V may be applied to the gate electrode and the drain electrode, respectively. Then, the electrons are trapped on the line indicated by b (cf. FIG. 12). In this way, in the case where a voltage which is applied to either one of the gate electrode or the drain electrode is varied, the electrons are trapped on the line of the nitride film 23.

As described in the foregoing, when applying a voltage with a given amplitude to either one of the drain electrode or the gate electrode during erasing, the positions of the electrons which are trapped in the nitride film 23 become uniform. It is therefore possible to minimize a difference between the threshold immediately after erasing and the threshold after a certain period of time from erasing.

In this embodiment, the voltage which is applied to the gate and the drain of the memory cell transistor is varied intentionally when performing writing or erasing. During writing, the electrons which are trapped in the insulating film such as the nitride film are thereby trapped uniformly without being concentrated on one place, thus minimizing a difference between the threshold immediately after writing and the threshold after a certain period of time from writing. Further, even if a part of the nitride film in which the electrons are trapped is broken, the dropout of electrons is small, thus also minimizing a change in the threshold.

During erasing, in order to erase all the electrons which are trapped during writing in the insulating film such as the nitride film, the positions of the holes which are injected into the insulating film such as the nitride film are changed with time so as to be uniformly combined with the electrons, thereby erasing all the electrons. This minimizes a difference between the threshold immediately after erasing and the threshold after a certain period of time from erasing.

Second Embodiment

Figure 4:
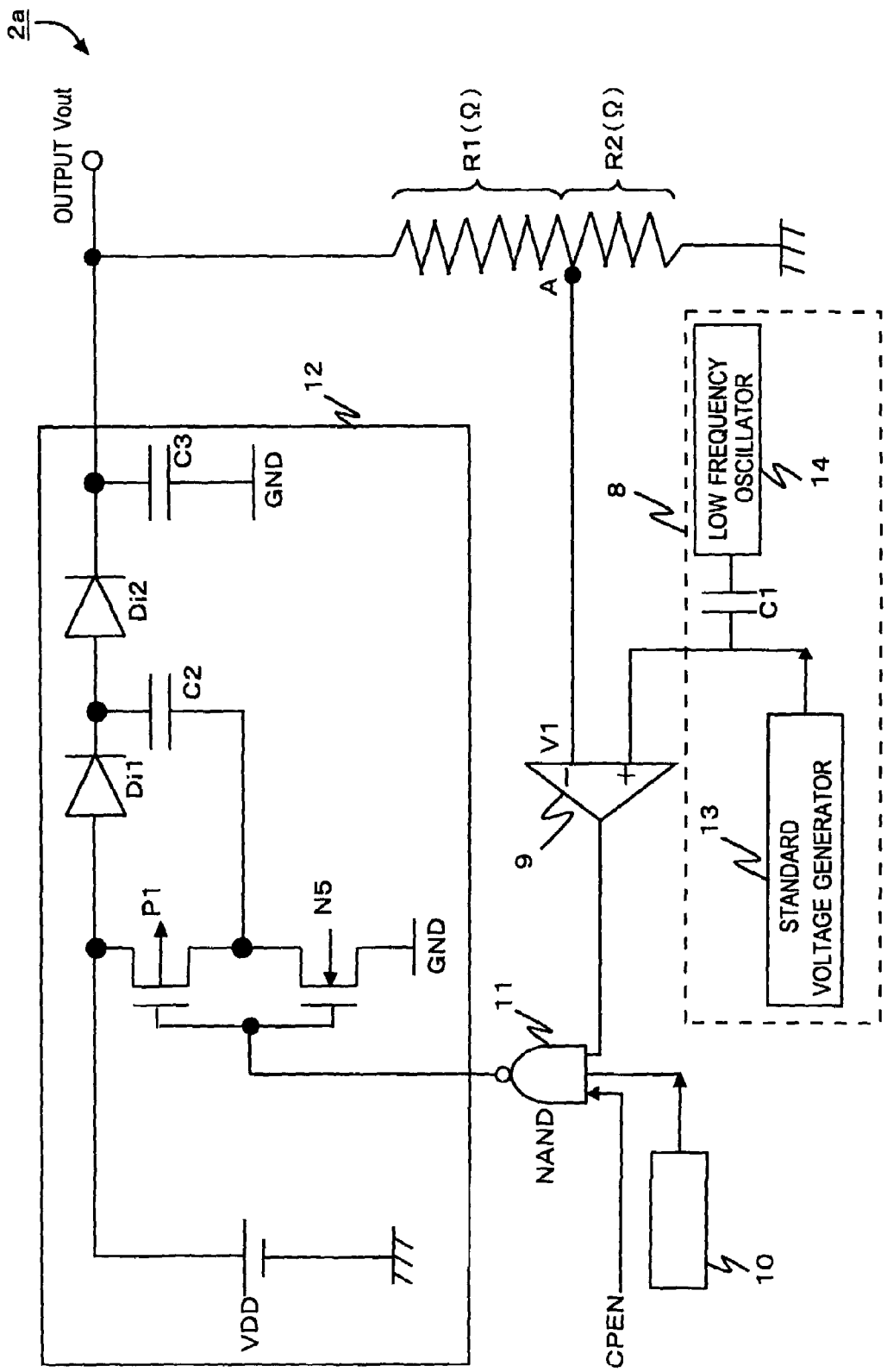
FIG. 4 is a view showing a drain voltage generator for nonvolatile memory according to the first embodiment.
Figure 23:
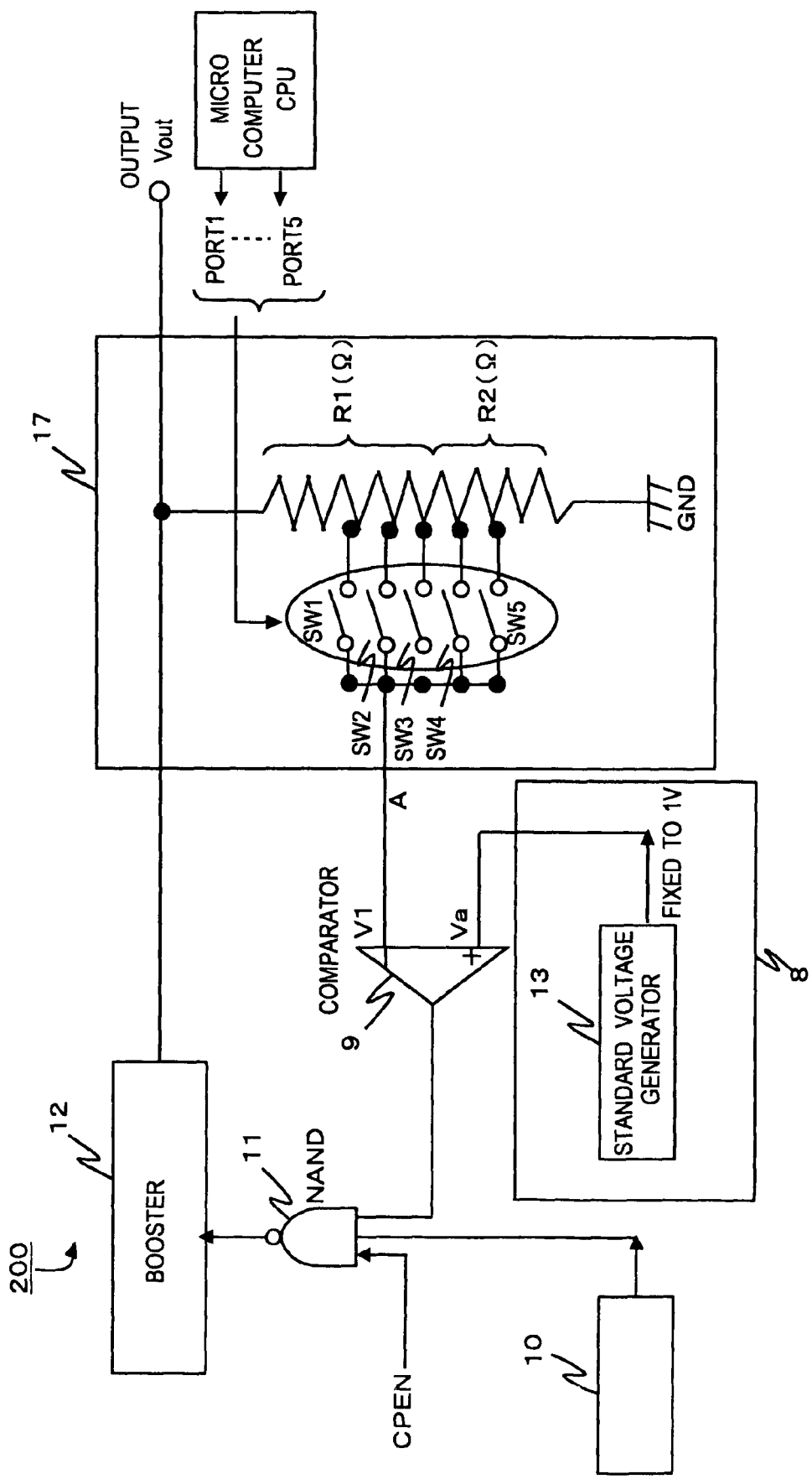
FIG. 23 is a view showing a drain voltage generator for nonvolatile memory according to a second embodiment of the present invention.
Figure 24:
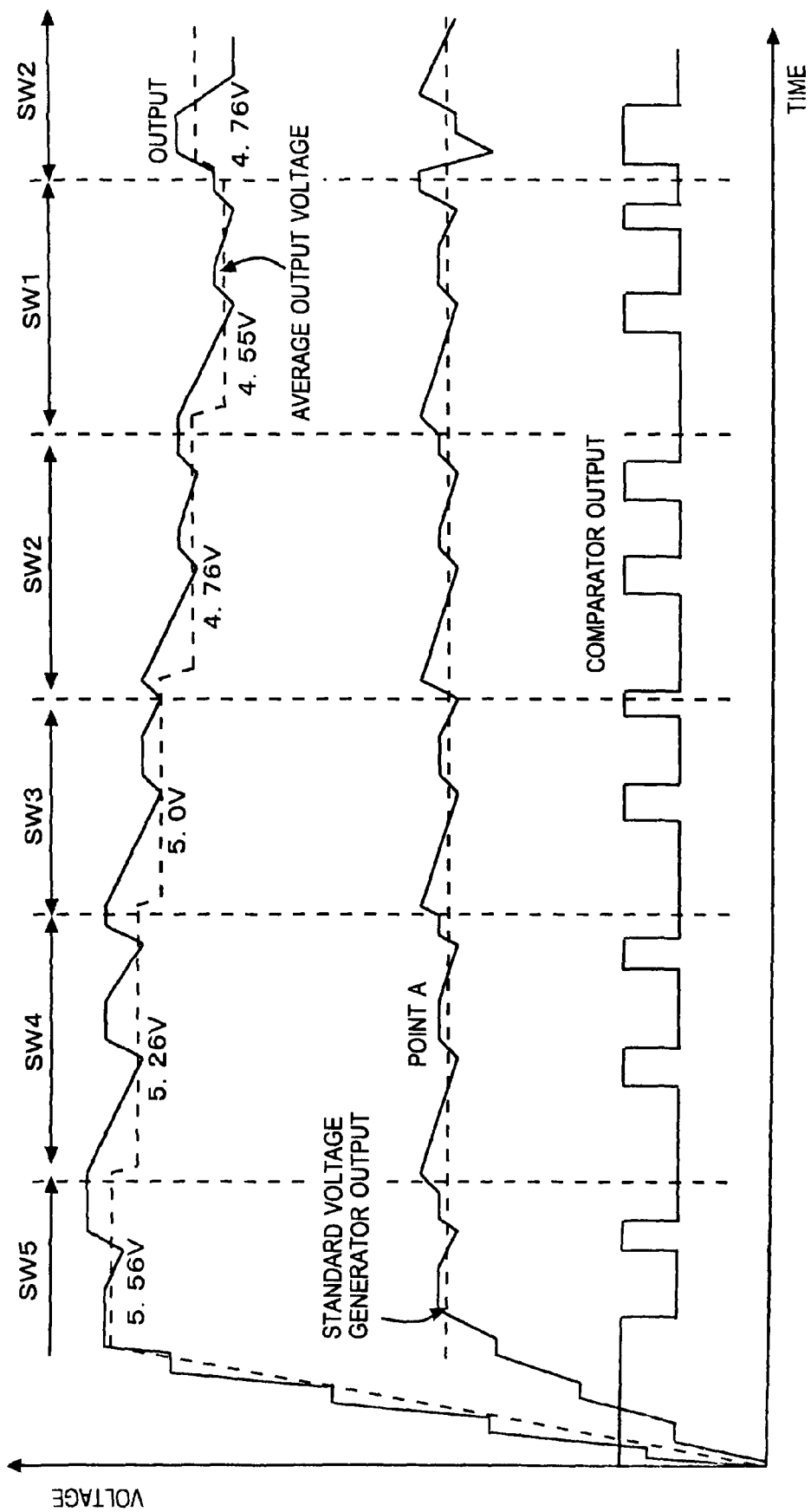
FIG. 24 is a view showing output waveforms of a voltage with a given amplitude which is output from a drain voltage generator for nonvolatile memory according to the second embodiment.

FIG. 23 shows a drain voltage generator 200 for nonvolatile memory according to a second embodiment of the present invention. In FIG. 23, the same elements as in FIG. 4 are denoted by the same reference numerals and not described in detail herein. The drain voltage generator 200 for nonvolatile memory shown in FIG. 23 includes a first voltage generator 17 which includes a first resistor R1, a second resistor R2, and a first switch SW1 to a fifth switch SW5 which are connected in parallel between the comparator 9 and the node of the first resistor R1 and the second resistor R2. The operation of the drain voltage generator 200 for nonvolatile memory according to the second embodiment is described hereinafter with reference to FIGS. 23 and 24. The output level of the standard voltage generator 13 is fixed to 1V. The resistance ratio of the first resistor R1 and the second resistor R2 which are placed on the output side of the booster 12 is set as follows.

The resistance ratio of the first resistor R1 and the second resistor R2 in the switch SW1 is 3.9:1.1. The resistance ratio of the first resistor R1 and the second resistor R2 in the switch SW2 is 3.95:1.05. The resistance ratio of the first resistor R1 and the second resistor R2 in the switch SW3 is 4.0:1.0. The resistance ratio of the first resistor R1 and the second resistor R2 in the switch SW4 is 4.05:0.95. The resistance ratio of the first resistor R1 and the second resistor R2 in the switch SW5 is 4.1:0.9.

The switch SW1 to the switch SW5 are controlled by a microcomputer, for example. According to the "H" level signal which is output from one of ports 1 to 5 of the microcomputer, the switches SW1 to SW5 which correspond to the ports 1 to 5, respectively, are controlled. The switches SW1 to SW5 may be controlled by a decoder circuit or a sequential circuit rather than by the microcomputer.

The case of turning ON the switch SW3 only, for example, is described below. Based on the signal which is output from the NAND circuit 11, the output of the booster 12 increases from 0V. The voltage at the node between the first resistor R1 and the second resistor R2 (which is referred to as the point A) increases according to the increase in the voltage of the output terminal Vout of the booster 12. The output Vout is represented as the point A×{(R1+R2)/R1}. Thus, the point A is represented as the output terminal Vout/5.

When the output Vout of the booster 12 reaches 5.0V, the voltage at the point A becomes 1.0V, which is equal to the output voltage of the standard voltage generator 13. If the booster 12 keeps boosting, the voltage at the point A becomes higher than 1.0V, and the comparator 9 outputs an "L" level signal. The output of the NAND circuit 11 is thereby fixed to "H" level, and therefore the booster 12 stops boosting. In this case, the output voltage of the booster 12 is a level that is slightly higher than 5.0V.

After that, the output voltage of the booster 12 starts decreasing due to the first resistor R1 and the second resistor R2 which are placed in the output portion of the booster 12. When the output voltage of the booster 12 falls below 5.0V, the voltage at the point A becomes lower than 1.0V. Then, the comparator 9 outputs an "H" level signal. Thus, the output of the NAND circuit 11 changes in accordance with the amplitude of the clock signal generator 10, and the booster 12 restarts boosting. As a result of repeating such operation, the booster 12 outputs the voltage of about 5.0V to the output terminal Vout. The output signal of the NAND circuit 11 and the output of the clock signal generator 10 are the same in relationship as the output signal of the comparator and the output signal of the NAND circuit shown in FIG. 7 and thus not described in FIG. 24.

The case of turning ON the switch SW4 only, for example, is described below. Based on the signal which is output from the NAND circuit 11, the output of the booster 12 increases from 0V. When the output voltage of the booster 12 reaches 5.26V, the voltage at the point A reaches 1.0V, which is equal to the output voltage of the standard voltage generator 13. If the booster 12 keeps boosting, the voltage at the point A becomes higher than 1.0V, and the comparator 9 outputs an "L" level signal. The output of the NAND circuit 11 is thereby fixed to "H" level, and therefore the booster 12 stops boosting. In this case, the output voltage of the booster 12 is a level that is slightly higher than 5.26V.

After that, the output voltage of the booster 12 starts decreasing due to the first resistor R1 and the second resistor R2 which are placed in the output portion of the booster 12. When the output voltage of the booster 12 falls below 5.26V, the voltage at the point A becomes lower than 1.0V. Then, the comparator 9 outputs an "H" level signal. Thus, the output of the NAND circuit 11 changes in accordance with the amplitude of the clock signal generator 10, and the booster 12 restarts boosting. As a result of repeating such operation, the booster 12 outputs the voltage of about 5.26V to the output terminal Vout.

As described above, the output of the booster 12 is 5V when the switch SW3 is selected, and the output of the booster 12 is 5.26V when the switch SW4 is selected. Further, the output of the booster 12 is 4.55V, 4.76V and 5.56V when the switch SW1, the switch SW2 and the switch SW5 is selected, respectively.

During writing, the selected switch is changed sequentially in the order of: the switch SW5, the switch SW4, the switch SW3, the switch SW2, the switch SW1 and the switch SW2, for example. As a result, the average output voltage of the booster 12 is output sequentially in the order of: 5.56V, 5.26V, 5V, 4.76V, 4.55V and 4.76V (cf. FIG. 24.)

The output level of the drain voltage generator 200 for nonvolatile memory can be changed by switching the switches SW1 to SW5 in this manner. The voltage is applied to the memory cell transistor with the use of the drain voltage generator 200 for nonvolatile memory described above.

The voltage which is applied during writing to the memory cell transistor is generated in the drain voltage generator 200 for nonvolatile memory and a gate voltage generator for nonvolatile memory (not shown). During the writing period, the output voltages of the drain voltage generator 200 for nonvolatile memory and the gate voltage generator for nonvolatile memory are varied. The details of the write operation and the verification after writing are the same as those in the first embodiment and thus not described herein.

The voltage which is applied during erasing of the memory cell transistor is also generated in the drain voltage generator 200 for nonvolatile memory and the gate voltage generator for nonvolatile memory. During the erasing period, the output voltages of the drain voltage generator 200 for nonvolatile memory and the gate voltage generator for nonvolatile memory are varied. The details of the erase operation and the verification after erasing are the same as those in the first embodiment and thus not described herein.

In this embodiment, the voltages which are applied to the gate and the drain of the memory cell transistor during writing or erasing are varied. Consequently, during writing, the electrons which are trapped in the insulating film such as the nitride film are trapped uniformly without being concentrated on one place, thereby minimizing a difference between the threshold immediately after writing and the threshold after a certain period of time from writing.

Further, during erasing, in order to erase all the electrons which are trapped during writing in the insulating film such as the nitride film, the positions of the holes which are injected into the insulating film such as the nitride film are changed with time so as to be uniformly combined with the electrons, thereby erasing all the electrons. This minimizes a difference between the threshold immediately after erasing and the threshold after a certain period of time from erasing.

In this embodiment, the first switch SW1 to the fifth switch SW5 are connected in parallel between the comparator 9 and the node of the first resistor R1 and the second resistor R2. In such a case, the switches SW1 to SW5 can be implemented easily by digital circuits. This allows easy application of the step-like voltage to the drain electrode and the gate electrode of the memory cell transistor. This also eliminates the need for placing the low frequency oscillator 14 and the capacitor C1, which are described in the first embodiment.

Figure 25A:
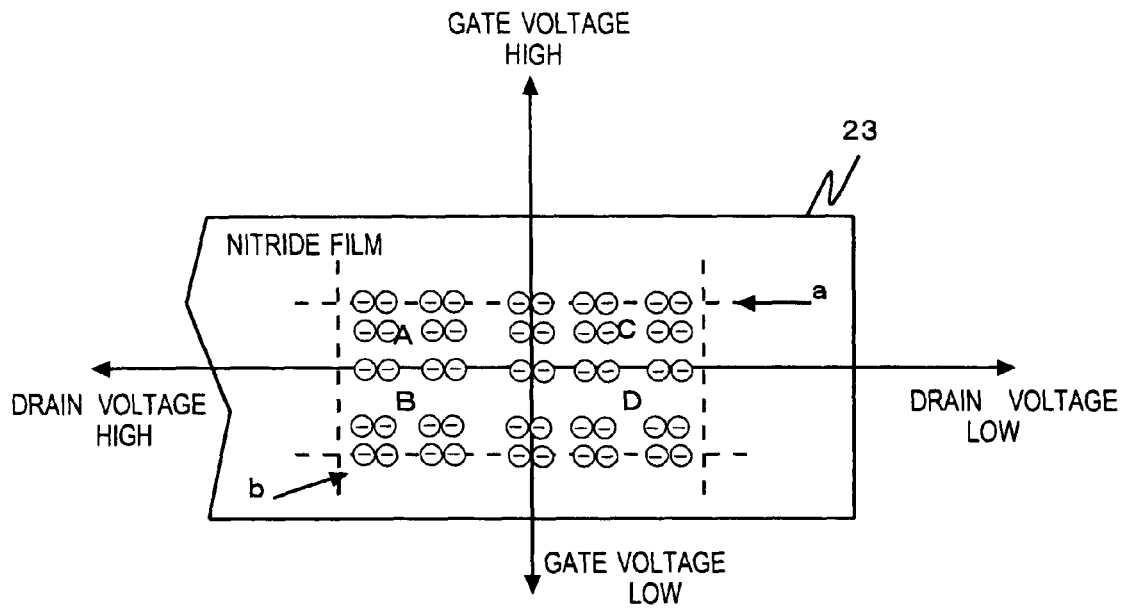
FIGS. 25A and 25B are views showing the state of electrons which are trapped in a nitride film according to the first embodiment and the second embodiment.
Figure 25B:
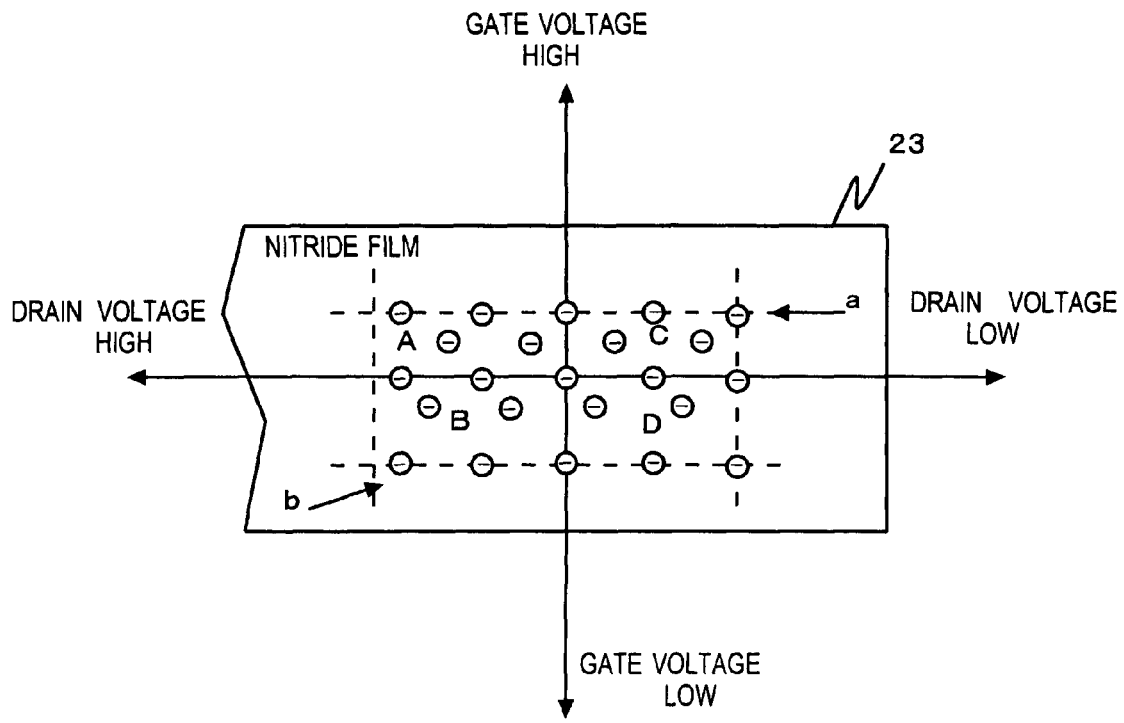

In the first embodiment, the voltage with a given amplitude is a sinusoidal wave. Thus, the positions where the electrons are trapped during writing are scattered within a predetermined range (cf. FIG. 25B). In the second embodiment, on the other hand, the voltage with a given amplitude changes steplike. Thus, the positions where the electrons are trapped during writing are arranged regularly to some degree (cf. FIG. 25A). Therefore, the voltage generator 2 for nonvolatile memory of the first embodiment enables more uniform trapping of the electrons in the nitride film compared with the voltage generator 200 for nonvolatile memory of the second embodiment.

Third Embodiment

Figure 26:
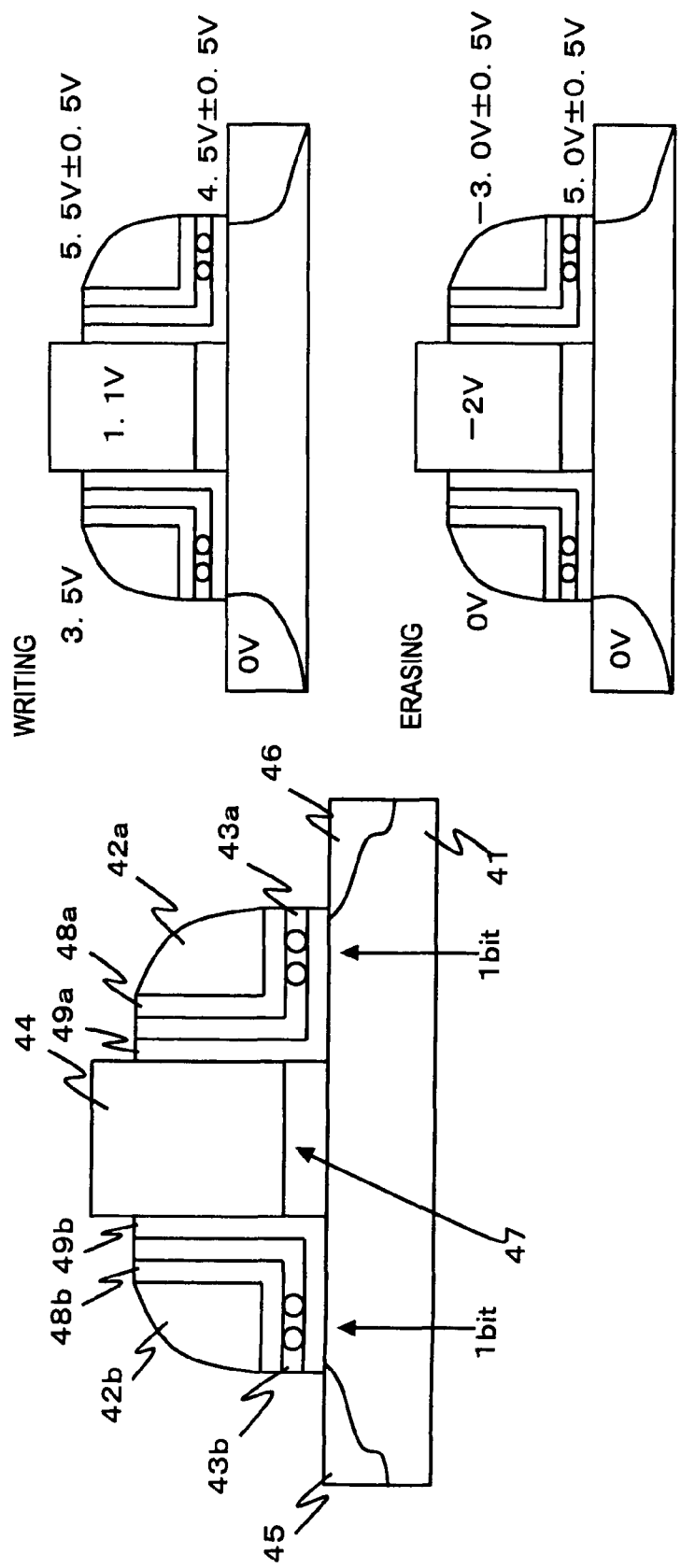
FIG. 26 is a view showing a Twin MONOS memory according to a third embodiment of the present invention.
Figure 27:
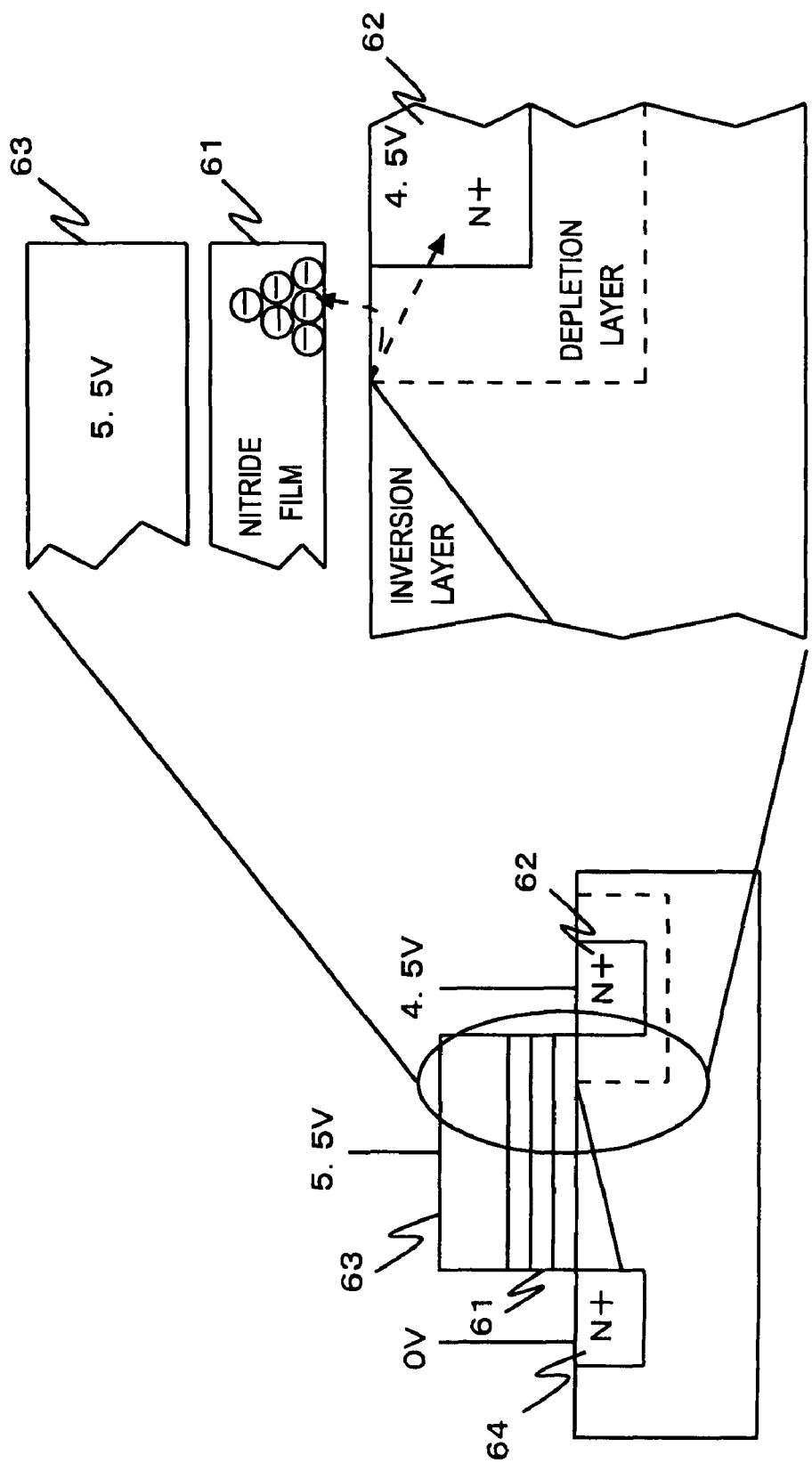
FIG. 27 is a view showing write operation of a MONOS memory according to a related art.
Figure 28:
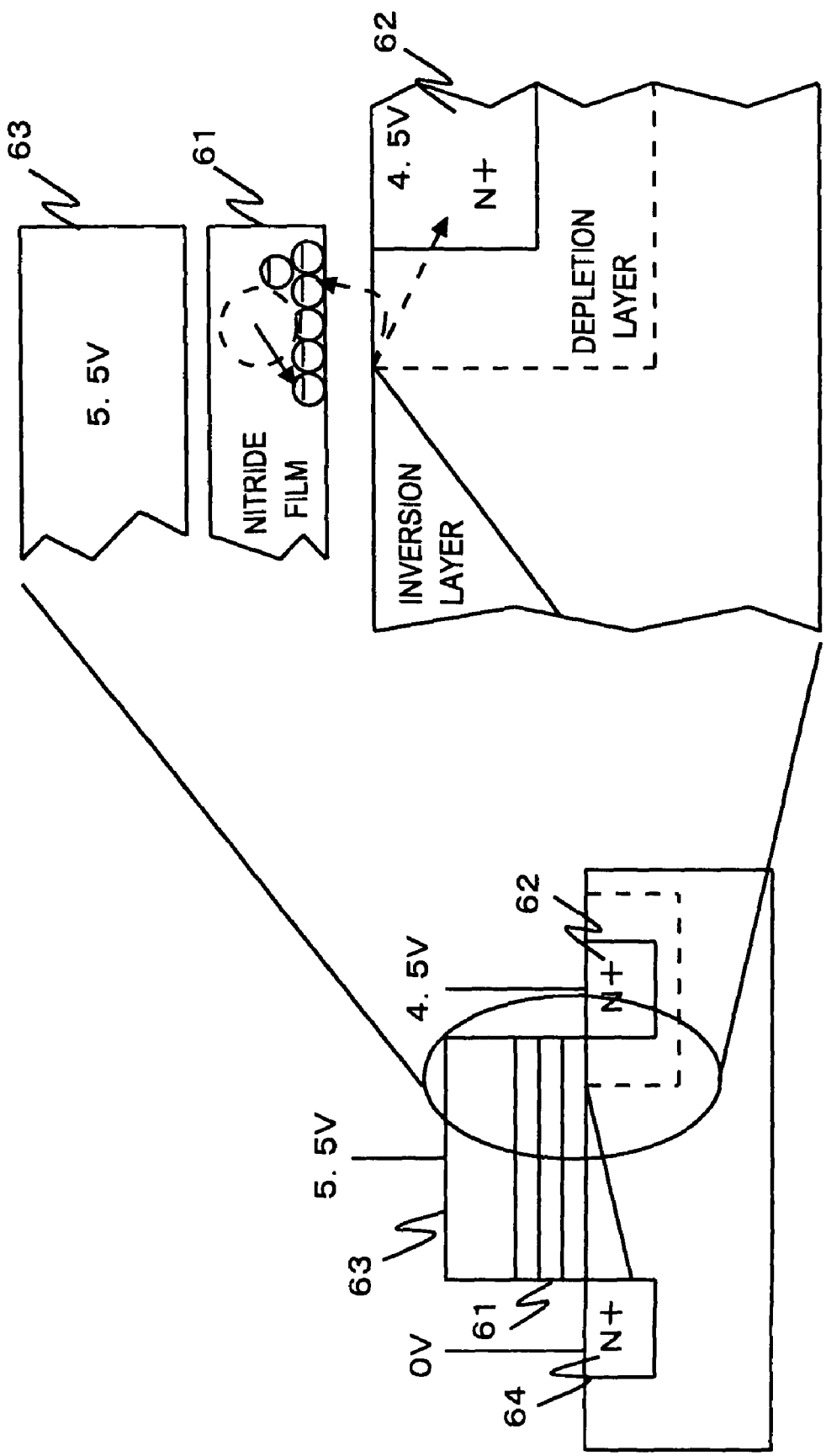
FIG. 28 is a view showing operation after a certain period of time from writing in a MONOS memory according to a related art.
Figure 29:
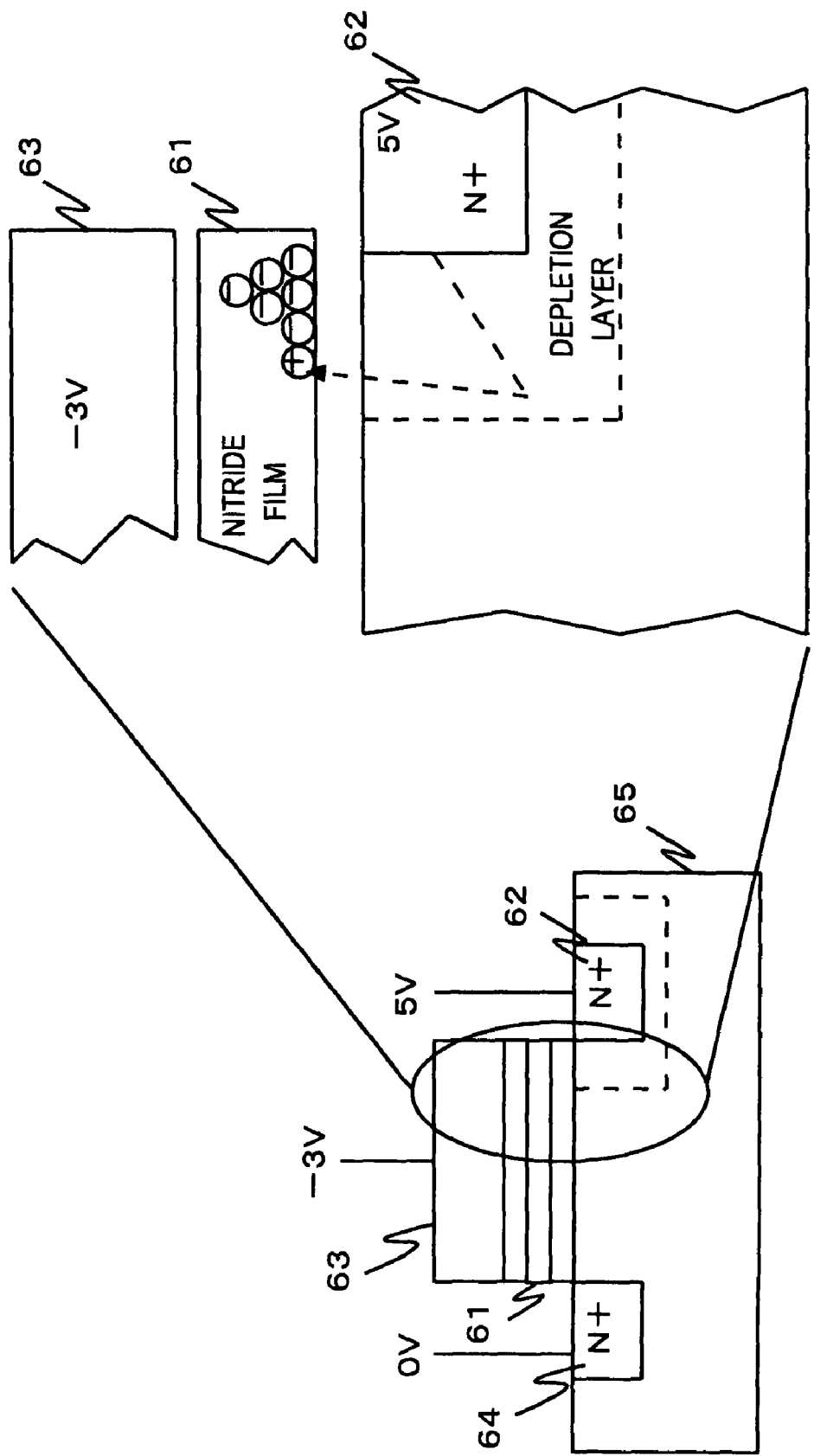
FIG. 29 is a view showing erase operation of a MONOS memory according to a related art.
Figure 30:
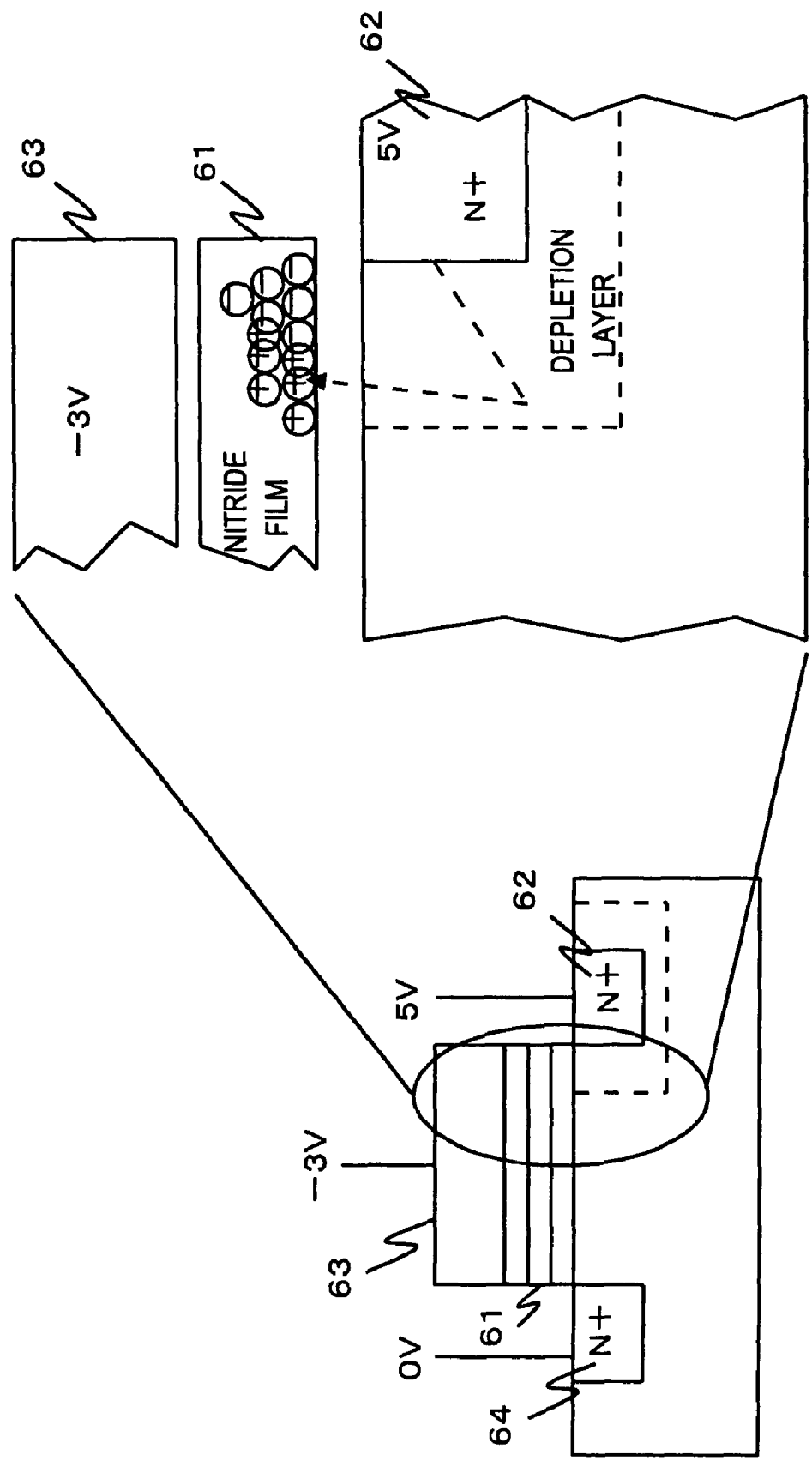
FIG. 30 is a view showing operation after a certain period of time from erasing in a MONOS memory according to a related art.
Figure 31:
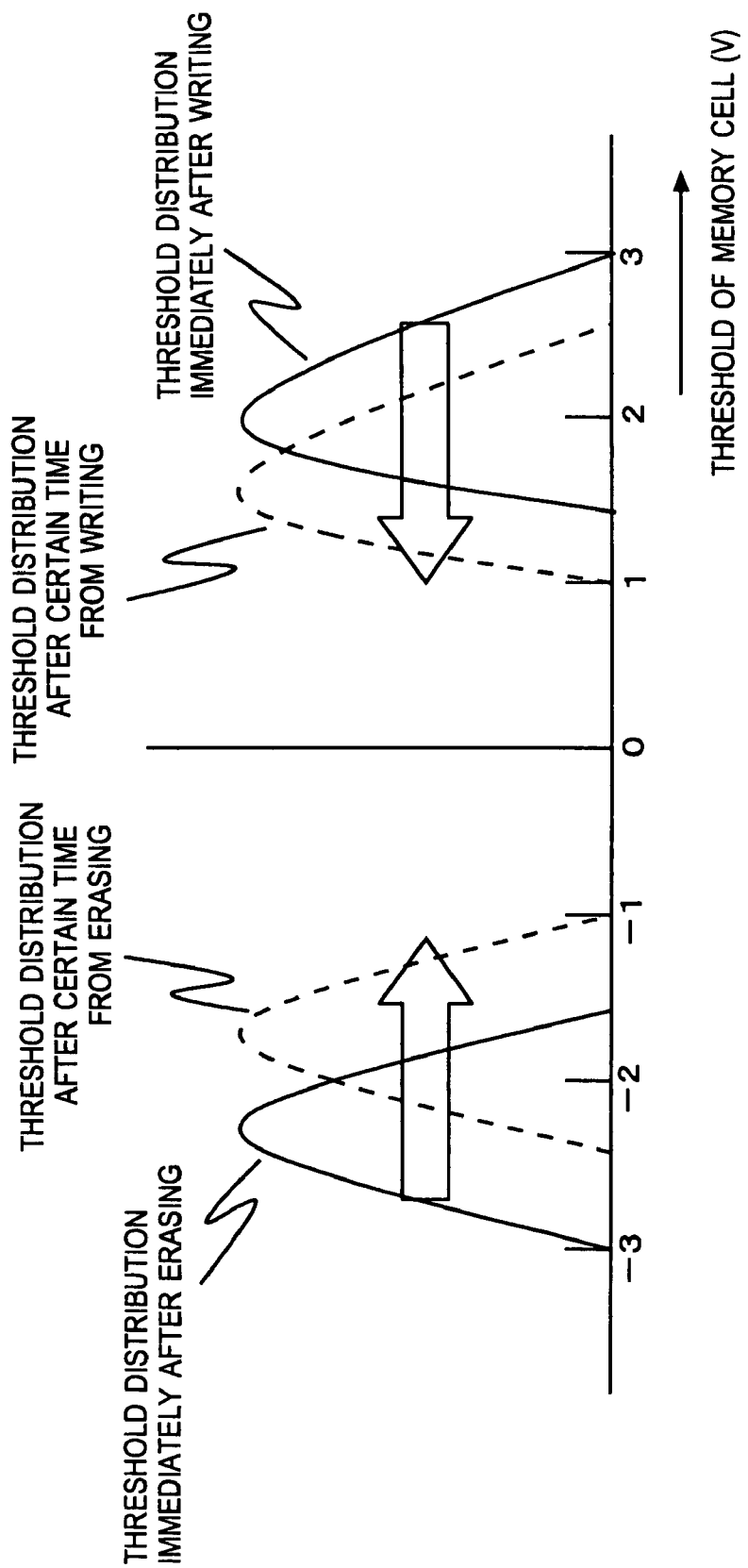
FIG. 31 is a view showing a change in a threshold of a memory cell transistor during writing and erasing according to a related art.

In the first and second embodiments above, the case of applying a voltage to a general MONOS memory cell transistor is described. In a third embodiment of the present invention, the case of applying a voltage to a Twin MONOS memory cell is described hereinbelow. FIG. 26 shows the structure of the Twin MONOS memory cell according to the third embodiment. The Twin MONOS memory cell includes two MONOS memory cells which are controlled one word gate and two control gates. The Twin MONOS memory cell which is shown in FIG. 26 includes a substrate 41, control gates 42a and 42b, nitride films 43a and 43b, first insulating layers 48a and 48b, second insulating layers 49a and 49b, a third insulating layer 47 and a word gate 44.

In the substrate 41, a source diffusion region 45 and a drain diffusion region 46 are formed. The word gate 44 is formed above the substrate 41 with the third insulating layer 47 interposed therebetween. On the both sides of the word gate 44, the nitride films 43a and 43b are formed with the second insulating layers 49a and 49b respectively interposed therebetween. On the both sides of the nitride films 43a and 43b, the control gates 42a and 42b are formed with the first insulating layers 48a and 48b respectively interposed therebetween. The word gate and the control gate which are shown in this embodiment may be referred to as a control gate and a memory gate, respectively. Further, the word gate which is placed above the substrate with the insulating layer interposed therebetween and the control gates which are placed on both sides of the word gate may be short-circuited so as to function as one control gate. The write operation and the erase operation of the Twin MONOS memory cell having such a structure are described hereinbelow.

During the write operation in the Twin MONOS memory cell, the voltages of 1.1V, 3.5V and 0V, for example, are applied to the word gate 44, the control gate 42b and the source electrode, respectively. Further, the voltages with amplitudes of 5.5V±0.5V and 4.5V±0.5V are applied to the control gate 42a and the drain electrode, respectively. The application of such voltages to each terminal enables the trapping of hot electrons in the nitride film.

The above-described write operation describes the voltage application when performing writing to the nitride film 43a on one side of the Twin MONOS memory cell. On the other hand, when performing writing to the nitride film 43b on the other side of the Twin MONOS memory cell, the voltage application to the two control gates and the source and the drain is made in the opposite manner. Specifically, the voltages of 1.1V, 3.5V, 5.5V±0.5V, 4.5V±0.5V and 0V are applied to the word gate 44, the control gates 42a and 42b, the source electrode 45 and the drain electrode 46, respectively. The application of such voltages to each terminal enables writing to the nitride film 43b.

The erase operation in the Twin MONOS memory cell is described below. During the erase operation in the Twin MONOS memory cell, the voltages of −2V, 0V and 0V, for example, are applied to the word gate 44, the control gate 42b and the source electrode 45, respectively. Further, the voltages with the amplitudes of −3.0V±0.5V and 5.0V±0.5V are applied to the control gate 42a and the drain electrode, respectively. The application of such voltages to each terminal enables the injection of holes into the nitride film 43a, thereby allowing the holes to be combined with the electrons so as to erase the electrons.

The above-described erase operation describes the voltage application when performing erasing in the nitride film 43a of the Twin MONOS memory cell. On the other hand, when performing erasing in the nitride film 43b of the Twin MONOS memory cell, the voltage application to the two control gates and the source and the drain is made in the opposite manner. Specifically, the voltages of −2V, 0V, −3.0V±0.5V, 5.0V±0.5V and 0V are applied to the word gate 44, the control gates 42a and 42b, the source electrode 45 and the drain electrode 46, respectively. The application of such voltages to each terminal enables erasing in the nitride film 43b.

When performing erasing in the nitride films 43a and 43b at the same time, the voltages of −2V, −3V, −3V, 5.0V and 5.0V are applied to the word gate 44, the control gates 42a and 42b, the source electrode 45 and the drain electrode 46, respectively. The application of such voltages to each terminal enables erasing in the nitride films 43a and 43b. The way of applying a voltage with a given amplitude to the Twin MONOS memory cell during the write operation and the erase operation is the same as that shown in the first embodiment and the third embodiment and thus not described in detail herein.

As described in the foregoing, in the nonvolatile memory 100 using the voltage generator 2 for nonvolatile memory according to the embodiment of the present invention, the electrons which are trapped in the insulating film such as the nitride film are trapped uniformly without being concentrated on one place during writing to the memory cell transistor. The threshold which is immediately after writing and the threshold which is after a certain period of time from writing are therefore not substantially different, thereby preventing the dropout of held electrons.

Further, because the electrons are trapped evenly in the insulating film during writing, even if a part of the insulating film is broken after writing due to an external factor, the electrons only in the broken portion are dropped out and the electrons in the other portion are not dropped out. This prevents the occurrence of an error in holding electrons.

During erasing, in order to erase all the electrons which are trapped during writing in the insulating film such as the nitride film, the positions of the holes which are injected into the insulating film such as the nitride film are changed with time so as to be uniformly combined with the electrons, thereby erasing all the electrons. The threshold which is immediately after erasing and the threshold which is after a certain period of time from erasing are therefore not substantially different, thereby preventing the characteristics of the memory cell transistor from varying largely.

Although writing is executed by hot electrons using an N-type transistor in the embodiments of the present invention, writing may be executed by hot holes.

In a booster of a related art, the output voltage when the booster shifts from the stopped state to the operating state is constant. Specifically, in the booster of a related art, the standard voltage which is generated by the standard voltage generator and input to the comparator and the voltage which is generated by the booster and input to the comparator are constant. On the other hand, in the booster of the above embodiments, at least one of the standard voltage which is input to the comparator and the voltage which is generated by the booster and input to the comparator is varied. Therefore, by changing the voltage value of the applied voltage which is output from the booster upon inversion of the boost operation control signal within one pulse-like voltage waveform, it is possible to generate a drain voltage or a gate voltage having a given amplitude in one write pulse voltage.

Further, a related art requires a substantial length of time for writing because it includes a step of applying a very low voltage to a gate after writing. On the other hand, a nonvolatile memory using a voltage generator for nonvolatile memory according to the embodiments of the present invention enables uniform injection of electrons into the insulating film in the process of the write operation. It is thereby possible to reduce a time for writing.

Furthermore, the semiconductor memory circuit of the embodiments of the present invention eliminates the need for placing a booster which generates a very low voltage to be applied to a gate. The circuit of the semiconductor memory thus can be configured only with a voltage generator which is necessary for writing. It is thereby possible to suppress an increase in layout size.

Although the embodiments of the present invention are described in detail above, the present invention is not limited to the above-described embodiments and may be varied in many ways. For example, the frequency of the clock signal generator 10 may be variable. Further, a delay circuit with a variable delay may be inserted into the output of the comparator 9. Such a configuration allows the output voltage of the booster 12 to be variable.

It is apparent that the present invention is not limited to the above embodiments, but may be modified and changed without departing from the scope and spirit of the invention.

What is claimed is:

1. A voltage generator for nonvolatile memory that generates an applied voltage to be applied to a nonvolatile memory, the voltage generator comprising:
    a first voltage generator to generate a first voltage corresponding to the applied voltage;
    a reference voltage generator to generate a reference voltage;
    a comparator to compare the first voltage with the reference voltage and output a boost operation control signal according to a comparison result; and
    a booster to generate the applied voltage in a pulse-like voltage waveform by starting or stopping boost operation based on the boost operation control signal,
    wherein the applied voltage corresponding to the first voltage, upon an inversion of the boost operation control signal, is varied within one pulse-like voltage waveform by varying one of the first voltage and the reference voltage.

2. The voltage generator for nonvolatile memory according to claim 1, wherein
    the reference voltage generator includes:
        a standard voltage generator to generate a standard voltage; and
        an oscillator connected with an output portion of the standard voltage generator through a capacitor, and
    the reference voltage generator outputs the standard voltage varied in synchronization with a change in an output level of the oscillator as the reference voltage.

3. The voltage generator for nonvolatile memory according to claim 1, wherein
    the first voltage generator includes:
    resistors connected in series between an output terminal of the booster and a ground voltage; and
    a plurality of switches connected between the comparator and the resistors, and
    the first voltage generator generates the first voltage by selectively switching the plurality of switches.

4. The voltage generator for nonvolatile memory according to claim 2, wherein
    the first voltage generator includes:
    resistors connected in series between an output terminal of the booster and a ground voltage; and
    a plurality of switches connected between the comparator and the resistors, and
    the first voltage generator generates the first voltage by selectively switching the plurality of switches.

5. The voltage generator for nonvolatile memory according to claim 1, further comprising:
    an arithmetic circuit to generate a signal for starting or stopping the boost operation based on the boost operation control signal.

6. A nonvolatile memory comprising:
    the voltage generator for nonvolatile memory according to claim 1; and
    a memory cell array to receive the applied voltage generated by the voltage generator for nonvolatile memory.

7. A microcomputer comprising the nonvolatile memory according to claim 6.

8. A writing and erasing method of a nonvolatile memory to perform writing and erasing on a nonvolatile memory by applying a given applied voltage, the method comprising:
    generating a first voltage corresponding to the applied voltage;
    generating a reference voltage;
    varying one of the first voltage and the reference voltage;
    comparing the first voltage with the reference voltage and generating a boost operation control signal according to a comparison result;
    generating the applied voltage in a pulse-like voltage waveform by starting or stopping boost operation based on the boost operation control signal; and
    applying the generated applied voltage to a nonvolatile memory, wherein
    the applied voltage corresponding to the first voltage, upon an inversion of the boost operation control signal, is varied within one pulse-like voltage waveform.

9. The voltage generator for nonvolatile memory according to claim 1, wherein the reference voltage generator outputs a voltage varied in synchronization with a change in an output level of an oscillator as the reference voltage.

10. The voltage generator for nonvolatile memory according to claim 1, wherein
    the reference voltage generator comprises:
        a standard voltage generator to generate a standard voltage; and
        a second unit receiving an output of the standard voltage generator,
    wherein the reference voltage generator outputs the standard voltage varied in synchronization with a change in an output level of the second unit as the reference voltage.

11. The voltage generator for nonvolatile memory according to claim 1, wherein the boost operation control signal comprises an output of a logical NAND operation of the output of the comparator, a clock signal, and a nonvolatile memory controller signal.

12. The voltage generator for nonvolatile memory according to claim 1, wherein the first voltage generator generates the first voltage by selectively switching from a plurality of voltages.

13. The voltage generator for nonvolatile memory according to claim 1, wherein the reference voltage generator includes a low frequency oscillator.

14. The method according to claim 8, wherein the generating the reference voltage comprises:
    generating a standard voltage; and
    outputting the standard voltage varied in synchronization with a change in an output level of an oscillating signal as the reference voltage.

15. The method according to claim 8, wherein the generating the reference voltage comprises outputting a standard voltage varied in synchronization with a change in an output level of an oscillating signal, as the reference voltage.

16. A voltage generator for nonvolatile memory that generates an applied voltage to be applied to a nonvolatile memory, the voltage generator comprising:
    a first voltage generator to generate a first voltage corresponding to the applied voltage;
    a reference voltage generator to generate a reference voltage;
    a comparator to compare the first voltage with the reference voltage and output a boost operation control signal according to a comparison result; and a booster to generate the applied voltage in a pulse-like voltage waveform by starting or stopping boost operation based on the boost operation control signal, wherein the applied voltage corresponding to the first voltage, upon an inversion of the boost operation control signal, is varied within one pulse-like voltage waveform by varying the reference voltage.

17. The voltage generator for nonvolatile memory according to claim 16, wherein the reference voltage generator comprises:

a standard voltage generator to generate a standard voltage; and an oscillator connected with an output portion of the standard voltage generator through a capacitor, and the reference voltage generator outputs the standard voltage varied in synchronization with a change in an output level of the oscillator as the reference voltage.

18. The voltage generator for nonvolatile memory according to claim 16, wherein the reference voltage generator outputs a voltage varied in synchronization with a change in an output level of an oscillator as the reference voltage.

19. The voltage generator for nonvolatile memory according to claim 16, further comprising a reference voltage generator to generate a variable output.

20. The voltage generator for nonvolatile memory according to claim 16, wherein the reference voltage generator outputs a voltage varied according to an oscillator as the reference voltage.

* * * * *